(12) United States Patent
Morimoto

(10) Patent No.: US 12,317,624 B2
(45) Date of Patent: May 27, 2025

(54) PHOTOELECTRIC CONVERSION APPARATUS HAVING AVALANCHE DIODES, SYSTEM AND MOVABLE BODY

(71) Applicant: CANON KABUSHIKI KAISHA, Tokyo (JP)

(72) Inventor: Kazuhiro Morimoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 444 days.

(21) Appl. No.: 17/821,737

(22) Filed: Aug. 23, 2022

(65) Prior Publication Data
US 2023/0069887 A1 Mar. 9, 2023

(30) Foreign Application Priority Data
Sep. 6, 2021 (JP) ................................. 2021-144929

(51) Int. Cl.
*H10F 39/18* (2025.01)
*H10F 39/00* (2025.01)

(52) U.S. Cl.
CPC ......... *H10F 39/8057* (2025.01); *H10F 39/18* (2025.01); *H10F 39/806* (2025.01); *H10F 39/8063* (2025.01); *H10F 39/8067* (2025.01); *H10F 39/807* (2025.01)

(58) Field of Classification Search
None
See application file for complete search history.

(56) References Cited

U.S. PATENT DOCUMENTS

| | | | | |
|---|---|---|---|---|
| 2008/0308738 A1* | 12/2008 | Li | ........................ | H10F 30/225 250/370.11 |
| 2009/0184384 A1* | 7/2009 | Sanfilippo | ............. | H01L 25/167 257/E31.119 |
| 2011/0291218 A1* | 12/2011 | Yamamura | ............ | H10F 77/147 257/E31.093 |
| 2014/0340541 A1* | 11/2014 | Shimotsusa | ............. | H10F 39/18 348/222.1 |

(Continued)

FOREIGN PATENT DOCUMENTS

| JP | 2020047780 A | 3/2020 |
|---|---|---|
| JP | 2021002542 A | 1/2021 |

(Continued)

*Primary Examiner* — Bilkis Jahan
(74) *Attorney, Agent, or Firm* — Canon U.S.A., Inc. IP Division

(57) ABSTRACT

A photoelectric conversion apparatus includes a plurality of avalanche diodes and a light shielding portion. The plurality of avalanche diodes is disposed in a semiconductor layer having a first surface and a second surface facing the first surface. The light shielding portion has an opening. The light shielding portion covers at least part of the first surface. Each of the plurality of avalanche diodes includes a first semiconductor region of a first conductivity type disposed at a first depth, and a second semiconductor region of a second conductivity type disposed at a second depth deeper than the first depth with respect to the second surface. The semiconductor layer includes a plurality of uneven structures provided on the first surface. In a planar view from a direction perpendicular to the first surface, the second semiconductor region overlaps the light shielding portion, and the first semiconductor region is included in the opening.

22 Claims, 22 Drawing Sheets

(56) References Cited

U.S. PATENT DOCUMENTS

2016/0254310 A1\* 9/2016 Yagi ................. H01L 21/76898
257/435

FOREIGN PATENT DOCUMENTS

| JP | 2021061330 A | 4/2021 |
|----|--------------|--------|
| JP | 2021072295 A | 5/2021 |
| JP | 2021090022 A | 6/2021 |
| JP | 2021100058 A | 7/2021 |

\* cited by examiner

PHOTOELECTRIC CONVERSION APPARATUS HAVING AVALANCHE DIODES, SYSTEM AND MOVABLE BODY

BACKGROUND

Field of the Embodiment

One disclosed aspect of the embodiments relates to a photoelectric conversion apparatus and a photoelectric conversion system.

DESCRIPTION OF THE RELATED ART

A certain photoelectric conversion apparatus has an uneven structure on a light-receiving surface of a photoelectric conversion element to refract incident light to extend the optical path length of the incident light in the photoelectric conversion element, thus improving the quantum efficiency. Japanese Patent Application Laid-Open No. 2021-002542 discusses a single-photon avalanche photodiode (SPAD) having an uneven structure called the moth-eye structure on a light incident surface side of a substrate.

SUMMARY

According to an aspect of the embodiments, a photoelectric conversion apparatus includes a plurality of avalanche diodes and a light shielding portion. The plurality of avalanche diodes is disposed in a semiconductor layer having a first surface and a second surface facing the first surface. The light shielding portion has an opening. The light shielding portion covers at least part of the first surface. Each of the plurality of avalanche diodes includes a first semiconductor region of a first conductivity type disposed at a first depth, and a second semiconductor region of a second conductivity type disposed at a second depth deeper than the first depth with respect to the second surface. The semiconductor layer includes a plurality of uneven structures provided on the first surface. In a planar view from a direction perpendicular to the first surface, the second semiconductor region overlaps the light shielding portion, and the first semiconductor region is included in the opening.

Further features of the disclosure will become apparent from the following description of exemplary embodiments with reference to the attached drawings.

DESCRIPTION OF THE EMBODIMENTS

Figure 1:
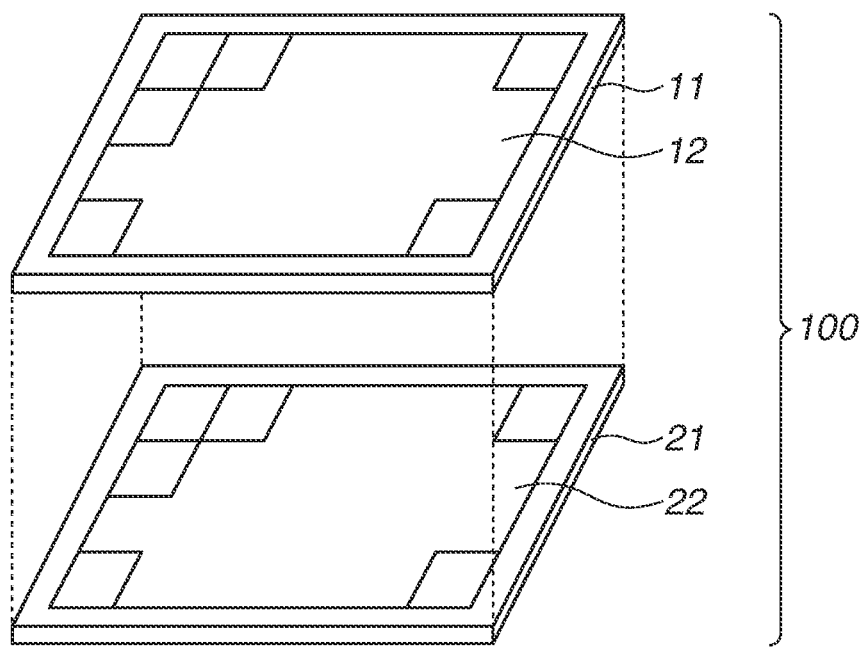
FIG. 1 is a schematic view illustrating a photoelectric conversion apparatus according to an exemplary embodiment.

The following exemplary embodiments are not intended to limit the disclosure but intended to embody the technical concept of the disclosure. In each drawing, sizes and positional relations of members may be exaggerated to clarify the descriptions. In the following descriptions, identical components are assigned the same reference numerals, and redundant descriptions thereof may be omitted. In the following, the term "unit" may refer to a software context, a hardware context, or a combination of software and hardware contexts. In the software context, the term "unit" refers to a functionality, an application, a software module, a function, a routine, a set of instructions, or a program that can be executed by a programmable processor such as a microprocessor, a central processing unit (CPU), or a specially designed programmable device or controller. A memory contains instructions or program that, when executed by the CPU, cause the CPU to perform operations corresponding to units or functions. In the hardware context, the term "unit" refers to a hardware element, a circuit, an assembly, a physical structure, a system, a module, or a subsystem. It may include mechanical, optical, or electrical components, or any combination of them. It may include active (e.g., transistors) or passive (e.g., capacitor) components. It may include semiconductor devices having a substrate and other layers of materials having various concentrations of conductivity. It may include a CPU or a programmable processor that can execute a program stored in a memory to perform specified functions. It may include logic elements (e.g., AND, OR) implemented by transistor circuits or any other switching circuits. In the combination of software and hardware contexts, the term "unit" or "circuit" refers to any combination of the software and hardware contexts as described above Exemplary embodiments of the disclosure will be described below with reference to the accompanying drawings. In the following descriptions, terms indicating a specific direction or position (e.g., "upper", "lower", "right", and "left", and other terms including these terms) are used as necessary. These terms are used with an intention to facilitate understanding of the exemplary embodiments to be described below with reference to the drawings, and the technical scope of the disclosure is not to be limited by the meanings of these terms.

In the present specification, a planar view refers to a view viewed from a direction perpendicular to a light incidence surface of a semiconductor layer. A cross-sectional view refers to a view of plane perpendicular to the light incidence surface of the semiconductor layer. If the light incidence surface of the semiconductor layer is a rough surface when macroscopically viewed, a planar view is defined with reference to the light incidence surface of the semiconductor layer when macroscopically viewed.

In the following descriptions, the anode of an avalanche photodiode (APD) is set to a fixed potential and a signal is taken out from the cathode side. Thus, a semiconductor region of a first conductivity type including, as a majority carrier, electric charges having the same polarity as signal charges is an N-type semiconductor region, and a semiconductor region of a second conductivity type including, as the majority carrier, electric charges having the different polarity from the signal charges is a P-type semiconductor region.

The disclosure is also implemented in a case where the cathode of the APD is set to a fixed potential and a signal is taken out from the anode side. In this case, the semiconductor region of the first conductivity type including, as the majority carrier, electric charges having the same polarity as the signal charges is the P-type semiconductor region, and the semiconductor region of the second conductivity type including, as the majority carrier, electric charges having the different polarity from the signal charges is the N-type semiconductor region. Although, in the following descriptions, a case is described where one node of the APD is set to a fixed potential, the potential of the two nodes may vary.

In the present specification, the term "impurity concentration", when simply used, means the net impurity concentration after deduction of a value compensated by an impurity of an opposite conductivity type. More specifically, the term "impurity concentration" refers to the net doping concentration. A region where the P-type additive impurity concentration is higher than the N-type additive impurity concentration is a P-type semiconductor region. Conversely, a region where the N-type additive impurity concentration is higher than the P-type additive impurity concentration is an N-type semiconductor region.

Configurations common to photoelectric conversion apparatuses according to exemplary embodiments of the disclosure and a method for driving such apparatuses will be described below with reference to FIGS. 1 to 5C.

FIG. 1 illustrates a configuration of a lamination type photoelectric conversion apparatus 100 according to each exemplary embodiment of the disclosure.

The photoelectric conversion apparatus 100 includes a sensor substrate 11 and a circuit substrate 21, which are stacked and electrically connected with each other. The sensor substrate 11 includes a first semiconductor layer including a photoelectric conversion element 102 (described below) and a first wiring structure. The circuit substrate 21 includes a second semiconductor layer including circuits such as a signal processing unit or circuit 103 (described below) and a second wiring structure. The photoelectric conversion apparatus 100 includes the second semiconductor layer, the second wiring structure, the first wiring structure, and the first semiconductor layer stacked in this order. The photoelectric conversion apparatus 100 according to each exemplary embodiment is a back side irradiation photoelectric conversion apparatus where light is incident on a first surface and the circuit substrate 21 is disposed on a second surface.

While the sensor substrate 11 and the circuit substrate 21 will be described below as being diced chips, the configuration is not limited to the chips. For example, each of the substrates may be a wafer. Each of the substrates may be stacked in a wafer state and then diced, or may be chipped, and chips may be stacked and bonded together.

The sensor substrate 11 is provided with a pixel region 12, and the circuit substrate 21 is provided with a circuit region 22 in which signals detected in the pixel region 12 are processed.

Figure 2:
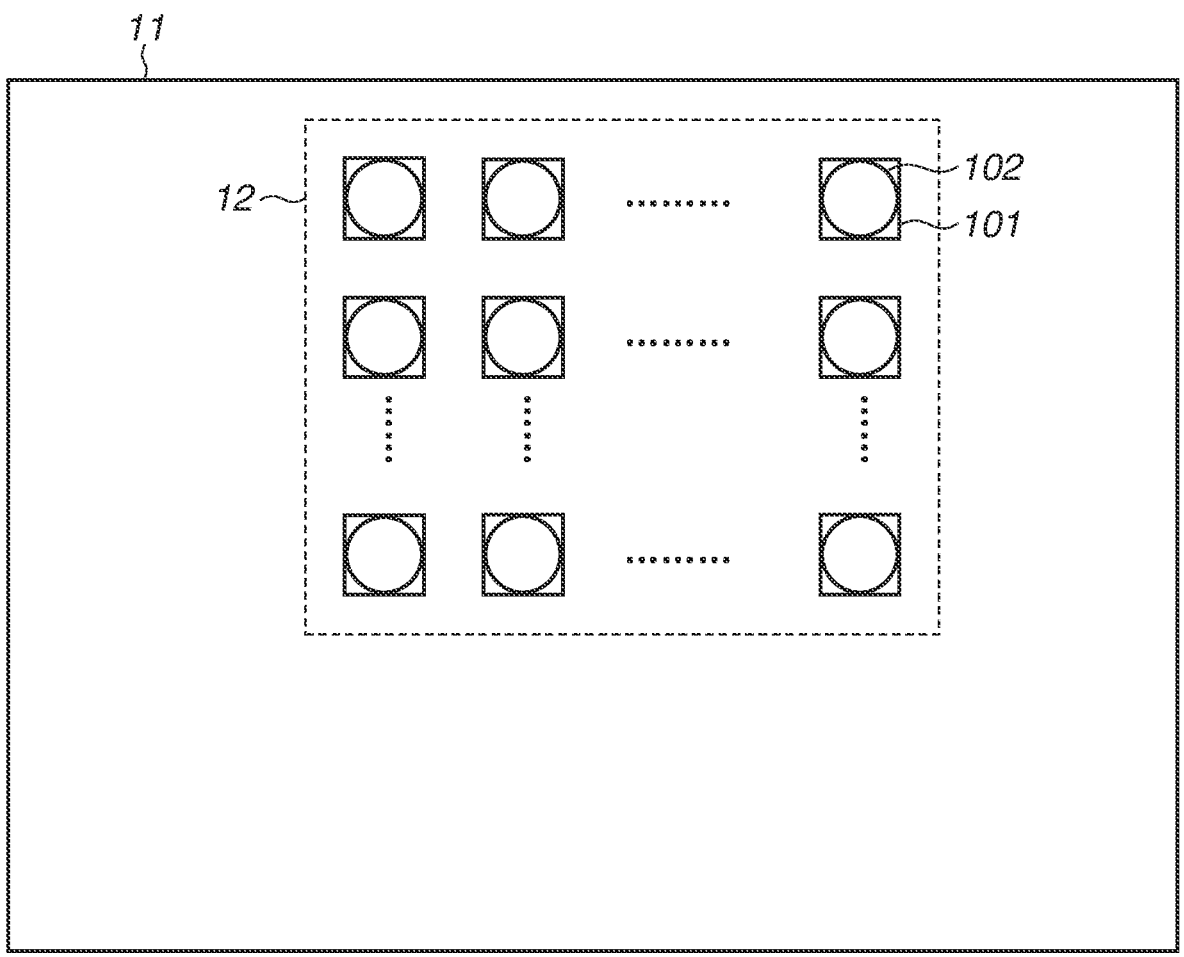
FIG. 2 is a schematic view illustrating a photodiode (PD) substrate of a photoelectric conversion apparatus according to an exemplary embodiment.

FIG. 2 illustrates an example configuration of the sensor substrate 11. Pixels 101 each including the photoelectric conversion element 102 including an avalanche photodiode (hereinafter referred to as an APD) are arranged in a two-dimensional array in a planar view to form the pixel region 12.

Although the pixels 101 are typically pixels for forming an image, the pixels 101 do not necessarily need to form an image when used in time of flight (ToF). More specifically, the pixels 101 may be pixels for measuring the arrival time of light and the light quantity.

Figure 3:
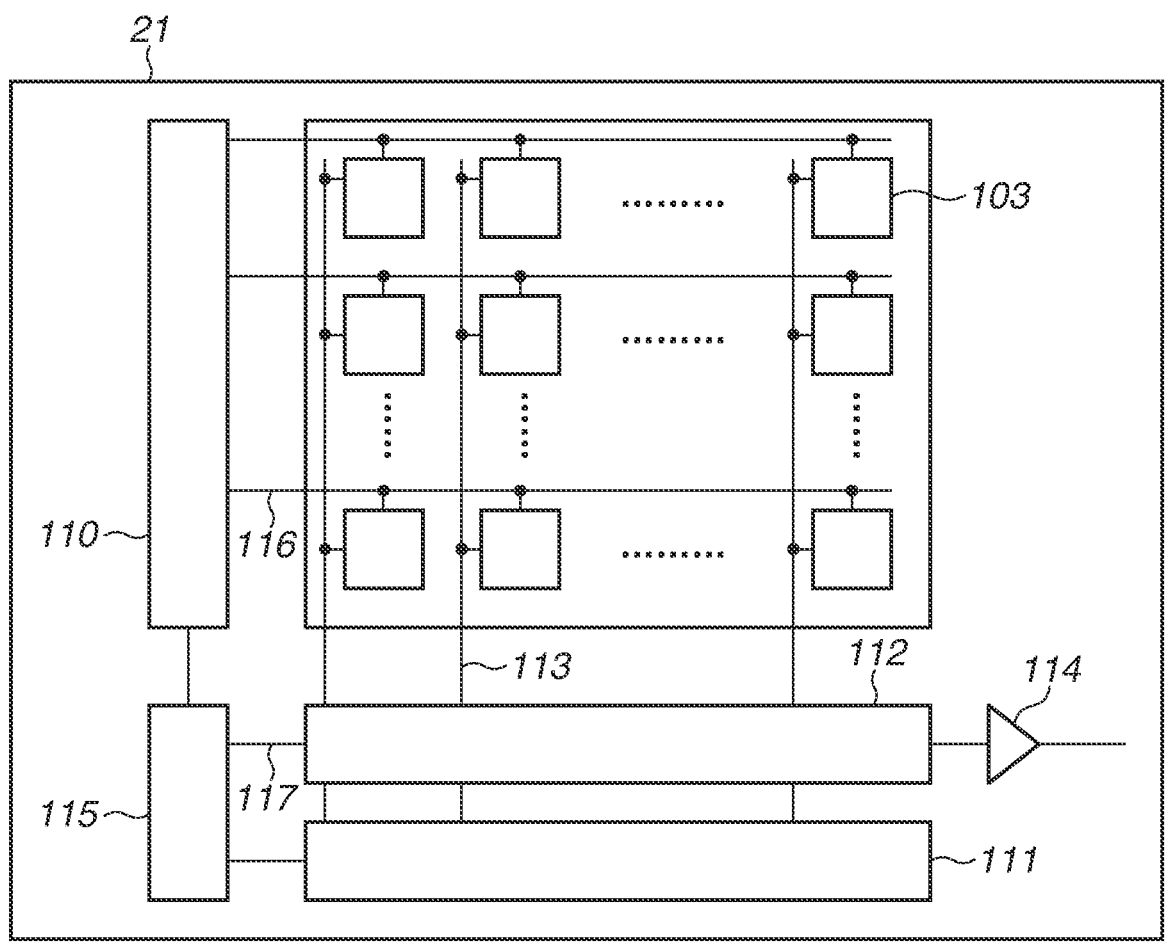
FIG. 3 is a schematic view illustrating a circuit substrate of a photoelectric conversion apparatus according to an exemplary embodiment.

FIG. 3 illustrates a configuration of the circuit substrate 21. The circuit substrate 21 includes a signal processing unit or circuit 103 that processes electric charges generated through photoelectric conversion by the photoelectric conversion element 102 in FIG. 2, a read circuit 112, a control pulse generation unit or circuit 115, a horizontal scanning circuit 111, a signal line 113, and a vertical scanning circuit 110.

The photoelectric conversion element 102 in FIG. 2 and the signal processing unit or circuit 103 in FIG. 3 are electrically connected via connection wiring provided for each of the pixels 101.

The vertical scanning circuit 110 receives a control pulse supplied from the control pulse generation unit or circuit 115 and supplies the control pulse to each of the pixels 101. A logic circuit such as a shift register and an address decoder is used as the vertical scanning circuit 110.

The signal output from the photoelectric conversion element 102 of each of the pixels 101 is processed by the signal processing unit or circuit 103. The signal processing unit or circuit 103 includes a counter and a memory that stores a digital value.

To read a signal from the memory of each of the pixels 101 storing a digital signal, the horizontal scanning circuit 111 inputs a control pulse to sequentially select each column to the signal processing unit or circuit 103.

With regard to a selected column, a signal is output from the signal processing unit or circuit 103 of a pixel 101 selected by the vertical scanning circuit 110 to the signal line 113.

The signal output to the signal line 113 is output to a recording unit or a signal processing unit outside the photoelectric conversion apparatus 100 via an output circuit 114.

In FIG. 2, an array of photoelectric conversion elements 102 in the pixel region 12 may be one-dimensionally arranged. The effect of the disclosure can still be obtained even if there is only one pixel, and such a case is also included in the disclosure. Not all of the photoelectric conversion elements 102 need to be provided with the function of the signal processing unit or circuit 103. For example, a plurality of photoelectric conversion elements 102 may share one signal processing unit, and signal processing may be sequentially performed.

As illustrated in FIGS. 2 and 3, a plurality of signal processing units or circuits 103 is disposed in a region overlapping the pixel region 12 in a planar view. The vertical scanning circuit 110, the horizontal scanning circuit 111, the read circuit 112, the output circuit 114, and the control pulse generation unit or circuit 115 are disposed to overlap a region between edges of the sensor substrate 11 and edges of the pixel region 12 in a planar view. In other words, the sensor substrate 11 includes the pixel region 12, and a non-pixel region disposed around the pixel region 12. The vertical scanning circuit 110, the horizontal scanning circuit 111, the read circuit 112, the output circuit 114, and the control pulse generation unit or circuit 115 are disposed in the region overlapping the non-pixel region in a planar view.

Figure 4:
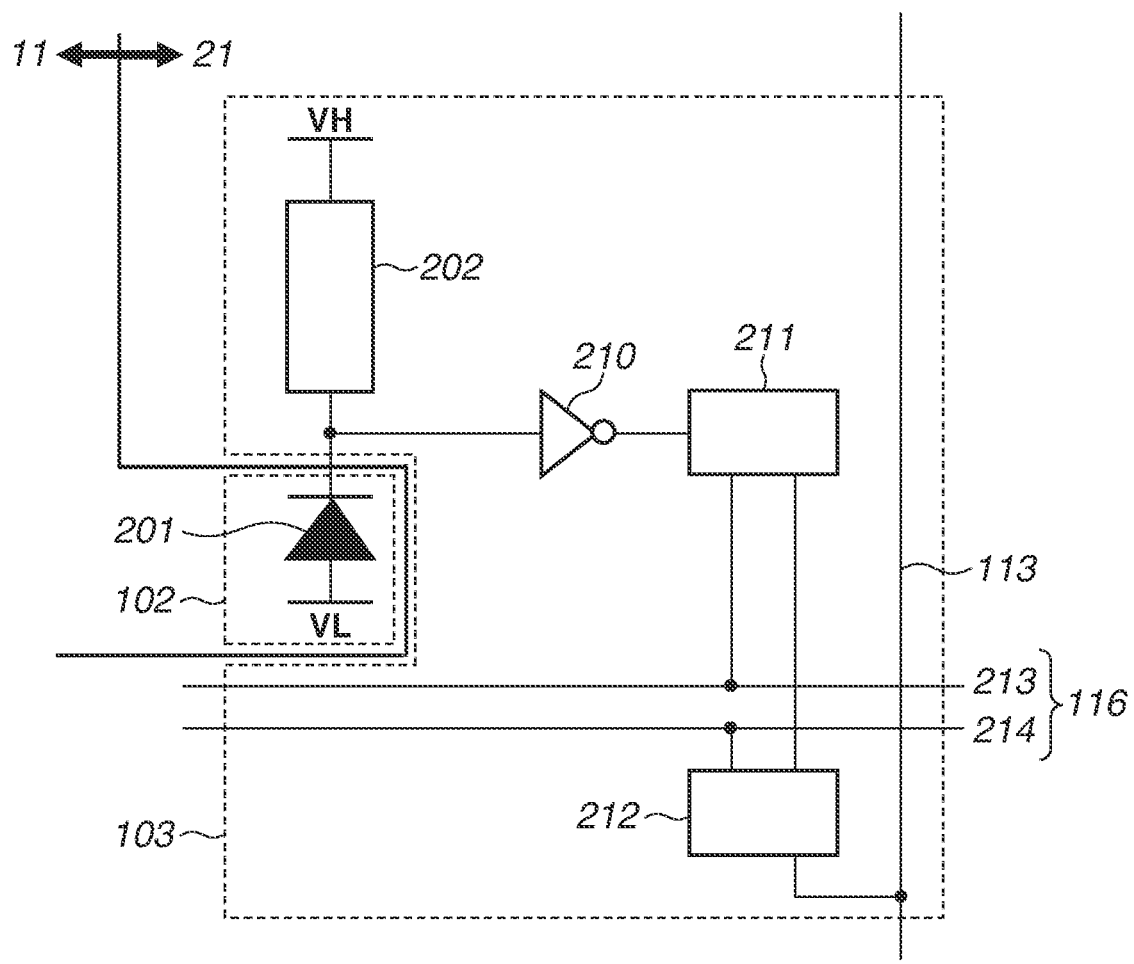
FIG. 4 illustrates an example configuration of a pixel circuit of a photoelectric conversion apparatus according to an exemplary embodiment.

FIG. 4 illustrates an example of a block diagram including equivalent circuits of the pixels in FIGS. 2 and 3.

The photoelectric conversion elements 102 each including an APD 201 in FIG. 2 are disposed on the sensor substrate 11, and other members are disposed on the circuit substrate 21.

The APD 201 generates a charge pair corresponding to incident light through the photoelectric conversion. The anode of the APD 201 is supplied with a voltage VL (first voltage). The cathode of the APD 201 is supplied with a voltage VH (second voltage) that is higher than the voltage VL supplied to the anode. The anode and the cathode are supplied with reverse bias voltages so that the APD 201 performs an avalanche multiplication operation. Supplying such voltages causes avalanche multiplication of electric charges generated by incident light, and generates an avalanche current.

When a reverse bias voltage is supplied, the APD 201 is operated in the Geiger or linear mode. In the Geiger mode, the APD 201 is operated with a potential difference between the anode and the cathode larger than the breakdown voltage. In the linear mode, the APD 201 is operated with the potential difference between the anode and the cathode close to, or equal to or less than the breakdown voltage.

An APD operated in the Geiger mode is referred to as a single-photon avalanche photodiode (SPAD). For example, the voltage VL (first voltage) is −30 V, and the voltage VH (second voltage) is 1 V. The APD 201 may be operated in either the linear or Geiger mode. It is desirable that the APD 201 be a SPAD since the SPAD has a larger potential difference providing a more remarkable effect of the withstand voltage than an APD in the linear mode.

A quench element 202 is connected to a power source supplying the voltage VH, and the APD 201. The quench element 202 functions as a load circuit (quench circuit) during signal multiplication by the avalanche multiplication. More specifically, the quench element 202 has a function of restricting the voltage to be supplied to the APD 201 to restrict the avalanche multiplication (quench operation). The quench element 202 also has a function of bringing back the voltage to be supplied to the APD 201 to the voltage VH by applying a current corresponding to a voltage drop in the quench operation (recharge operation).

The signal processing unit or circuit 103 includes a waveform shaping unit or circuit 210, a counter circuit 211, and a selection circuit 212. In the present specification, the signal processing unit or circuit 103 is to include any one of the waveform shaping unit or circuit 210, the counter circuit 211, and the selection circuit 212.

The waveform shaping unit or circuit 210 shapes a potential variation of the cathode of the APD 201 obtained in photon detection, and outputs a pulse signal. For example, an inverter circuit is used as the waveform shaping unit or circuit 210. Although, in the example in FIG. 4, one inverter is used as the waveform shaping unit or circuit 210, a circuit formed of a plurality of inverters connected in series or other circuits having a waveform shaping effect may also be used.

The counter circuit 211 counts the pulse signal output from the waveform shaping unit or circuit 210, and holds a count value. When a control pulse pRES is supplied via a drive line 213, the signal held by the counter circuit 211 is reset.

The selection circuit 212 is supplied with a control pulse pSEL from the vertical scanning circuit 110 in FIG. 3 via a drive line 214 in FIG. 4 (not illustrated in FIG. 3) to electrically connect or disconnect between the counter circuit 211 and the signal line 113. The selection circuit 212 includes, for example, a buffer circuit for outputting a signal.

A switch such as a transistor may be disposed between the quench element 202 and the APD 201 and between the photoelectric conversion element 102 and the signal processing unit or circuit 103 to change the electrical connection. Likewise, the supply of the voltage VH or VL to the photoelectric conversion element 102 may be electrically changed by using a switch such a transistor.

The present exemplary embodiment has been described above centering on the configuration using the counter circuit 211. However, instead of using the counter circuit 211, the photoelectric conversion apparatus 100 may acquire a pulse detection timing by using a Time to Digital Converter (hereinafter referred to as a TDC) and a memory. In this case, a timing of generation of the pulse signal output from the waveform shaping unit or circuit 210 is converted into a digital signal by the TDC. For the measurement of the timing for the pulse signal, the TDC is supplied with a control pulse pREF (reference signal) from the vertical scanning circuit 110 in FIG. 1 via a drive line. The TDC acquires, as a digital signal, a signal when the input timing of the signal output from each of the pixels via the waveform shaping unit or circuit 210 is assumed as relative time, with reference to the control pulse pREF.

Figure 5A:
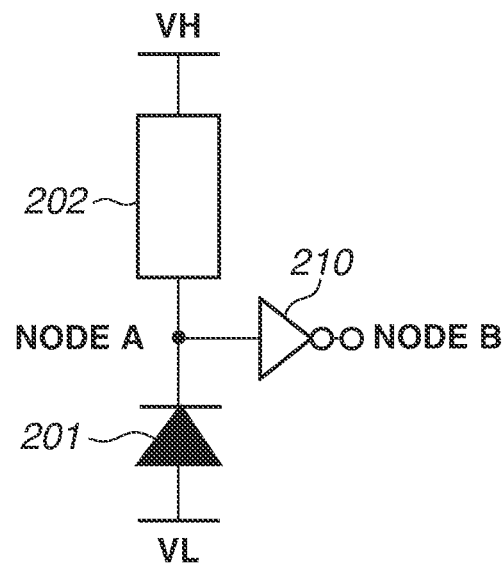
FIGS. 5A, 5B, and 5C are schematic diagrams illustrating drive of the pixel circuit of a photoelectric conversion apparatus according to an exemplary embodiment.
Figure 5B:
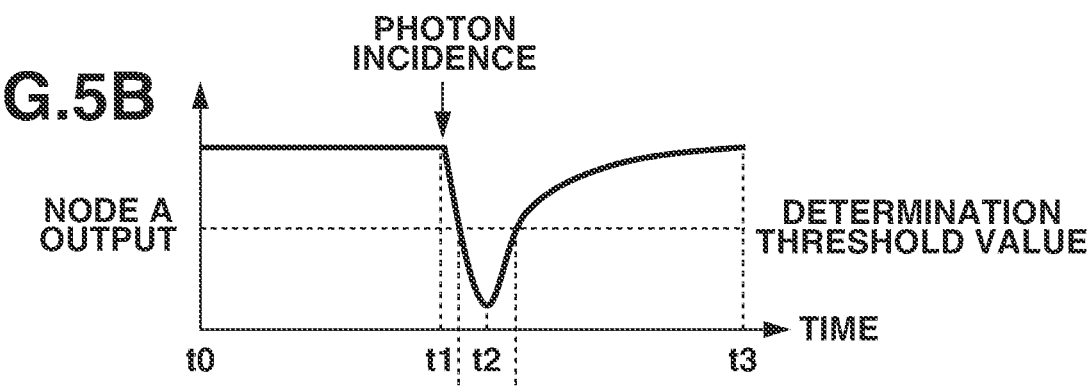
Figure 5C:
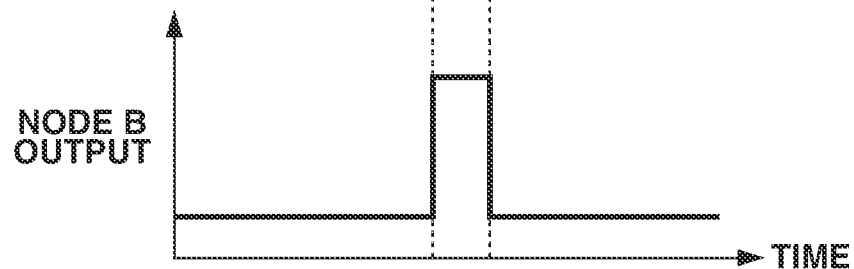

FIGS. 5A, 5B, and 5C schematically illustrate a relation between operation of the APD and an output signal.

FIG. 5A illustrates the APD 201, the quench element 202, and the waveform shaping unit or circuit 210 extracted from FIG. 4. The input side of the waveform shaping unit or circuit 210 is referred to as a node A, and the output side thereof is referred to as a node B. FIG. 5B illustrates a waveform variation at the node A in FIG. 5A, and FIG. 5C illustrates a waveform variation at the node B in FIG. 5A.

During a time period between time t0 and time t1, the potential difference between VH and VL is applied to the APD 201 in FIG. 5A. When photons are incident on the APD 201 at the time t1, the avalanche multiplication occurs in the APD 201, an avalanche multiplication current flows in the quench element 202, and a voltage drop occurs at the node A. When an amount of voltage drop further increases to decrease the potential difference applied to the APD 201, the avalanche multiplication of APD 201 stops at time t2, and the voltage level at the node A does not drop below a predetermined value. Then, during a time period between time t3 and the time t2, a current that compensates for the voltage drop from the voltage VL flows through the node A. At the time t3, the voltage level at the node A returns to be static at the former potential level. At this timing, a portion of an output waveform exceeding a threshold value at the node A is shaped by the waveform shaping unit or circuit 210 and then output as a signal at the node B.

Arrangements of the signal lines 113, the read circuit 112, and the output circuit 114 are not limited to the arrangements in FIG. 3. For example, the signal lines 113 may be extended in the row direction, and the read circuit 112 may be disposed at a position where the signal lines 113 are extended to.

The photoelectric conversion apparatus 100 according to each exemplary embodiment will be described below.

The photoelectric conversion apparatus 100 according to a first exemplary embodiment will be described below with reference to FIGS. 6 to 11.

Figure 6:
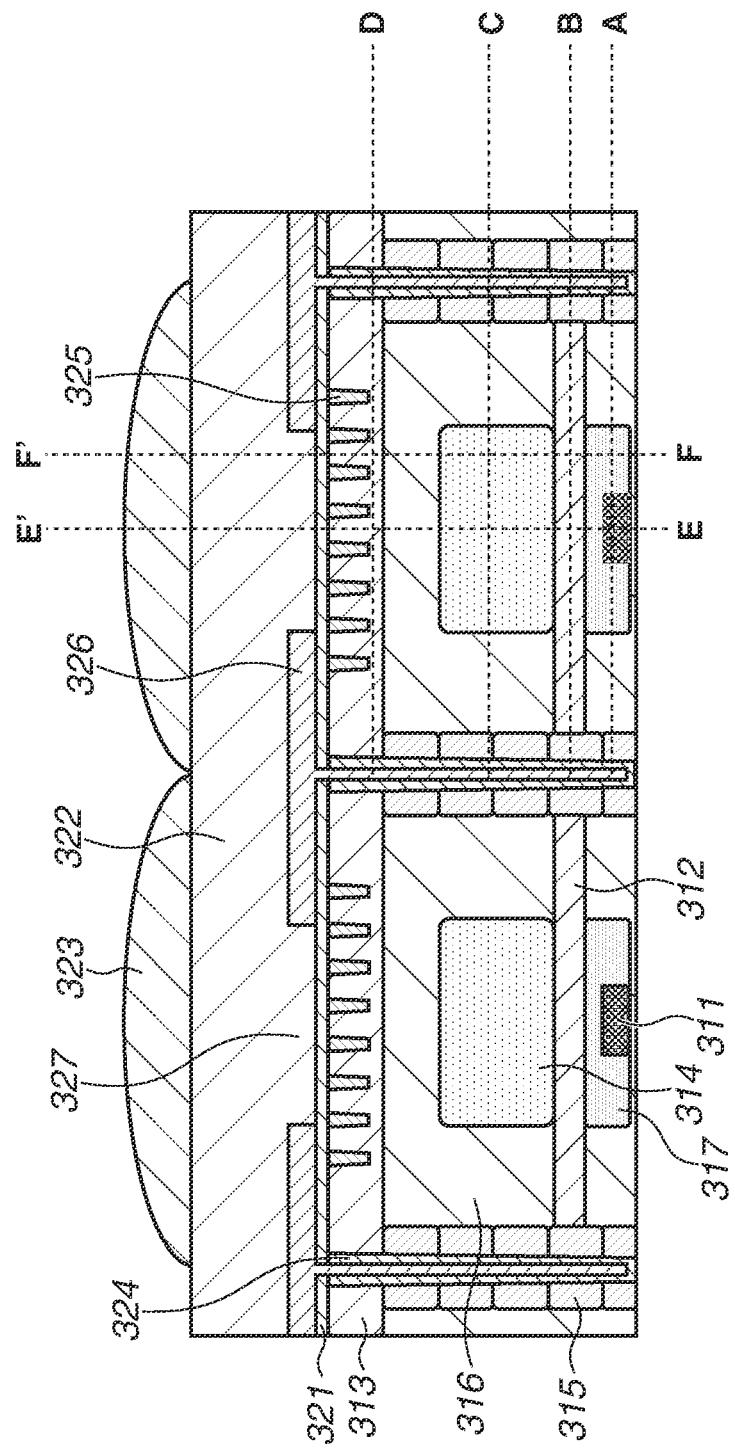
FIG. 6 is a cross-sectional view illustrating a photoelectric conversion element according to a first exemplary embodiment.

FIG. 6 is a cross-sectional view illustrating two adjacent pixels each including the photoelectric conversion elements 102 of the photoelectric conversion apparatus 100 according to the first exemplary embodiment taken in a direction perpendicular to a planar direction of the substrate.

The structure and function of the photoelectric conversion element 102 will be described below. The photoelectric conversion element 102 includes a first semiconductor region 311, a fourth semiconductor region 314, a sixth semiconductor region 316, and a seventh semiconductor region 317 which are of the N type. The photoelectric conversion element 102 further includes a second semiconductor region 312, a third semiconductor region 313, and a fifth semiconductor region 315 which are of the P type.

In the present exemplary embodiment, in the cross section illustrated in FIG. 6, the N-type first semiconductor region 311 is formed in the vicinity of a plane facing the light incidence surface, and the N-type seventh semiconductor region 317 is formed around the first semiconductor region 311. The P-type second semiconductor region 312 is formed at a position overlapping the first and seventh semiconductor regions 311 and 317 in a planar view. The N-type fourth semiconductor region 314 is disposed at a position overlapping the second semiconductor region 312 in the planar view, and the N-type sixth semiconductor region 316 is formed around the fourth semiconductor region 314. In other words, each of the plurality of avalanche diodes includes a first semiconductor region 311 disposed at a first depth, and a second semiconductor region 312 disposed at a second depth deeper than the first depth with respect to the second surface.

The first semiconductor region 311 has a higher N-type impurity concentration than the fourth semiconductor region 314 and the seventh semiconductor region 317. A PN junction is formed between the P-type second semiconductor region 312 and the N-type first semiconductor region 311. An entire region of the second semiconductor region 312 becomes a depletion region by making the impurity concentration of the second semiconductor region 312 lower than the impurity concentration of the first semiconductor region 311. Further, the depletion region extends to a part of the first semiconductor region 311, and an intense electric field is induced in the extended depletion region. The intense electric field causes the avalanche multiplication in the depletion region extending to a part of the first semiconductor region 311, and a current based on amplified electric charges is output as a signal charges. When the light incident on the photoelectric conversion element 102 is photoelectrically converted, and the avalanche multiplication takes place in the depletion region (avalanche multiplication region), generated electric charges of the first conductivity type are collected in the first semiconductor region 311.

Although, in FIG. 6, the fourth semiconductor region 314 and the seventh semiconductor region 317 are formed in substantially the same size, the size of each semiconductor region is not limited thereto. For example, the fourth semiconductor region 314 larger than the seventh semiconductor region 317 may be formed to collect electric charges from a wider range to the first semiconductor region 311.

A trench-based uneven structure 325 is formed on the surface on the light incidence side of the semiconductor layer. The uneven structure 325 surrounded by the P-type third semiconductor region 313 scatters light incident on the photoelectric conversion element 102. Since incident light obliquely advances through the photoelectric conversion element 102, an optical path length larger than or equal to the thickness of a semiconductor layer 301 can be secured. This makes it possible to photoelectrically convert light with a longer wavelength than in a case where the uneven structure 325 is not provided. The uneven structure 325 prevents reflection of the incident light in the substrate, thus an effect of improving the photoelectric conversion efficiency for the incident light can be obtained.

The fourth semiconductor region 314 and the uneven structure 325 are formed to overlap with each other in the planar view. The area of a portion of the fourth semiconductor region 314 overlapping the uneven structure 325 is larger than the area of a portion of the fourth semiconductor region 314 not overlapping the uneven structure 325. The moving time for electric charges generated at far positions from the avalanche multiplication region, formed between the first semiconductor region 311 and the fourth semiconductor region 314, to reach the avalanche multiplication region is longer than the moving time for electric charges generated at near positions from the avalanche multiplication region to reach the avalanche multiplication region. Thus, a timing jitter may possibly be degraded. Disposing the fourth semiconductor region 314 and the uneven structure 325 at positions where they overlap with each other in the planar view enables increasing the electric field at a deep portion of the photodiode. This enables reducing the collection time for electric charges generated at far positions from the avalanche multiplication region, thus reducing the timing jitter.

The third semiconductor region 313 that three-dimensionally covers the uneven structure 325 enables prevention of generation of thermal excitation electric charges at an interface portion of the uneven structure 325. This prevents a dark count rate (DCR) of the photoelectric conversion element 102.

Pixels are separated by a pixel separation portion 324 having the trench structure. The P-type fifth semiconductor region 315 formed around the pixel separation portion 324 separates adjacent photoelectric conversion elements 102 by a potential barrier. Since the photoelectric conversion elements 102 are also separated by the potential of the fifth semiconductor region 315, a trench structure that the pixel separation portion 324 has is not essential as a pixel separation portion. In a case where the pixel separation portion 324 is provided, the depth and position thereof are not limited to those in the configuration in FIG. 6. The pixel separation portion 324 may be a deep trench isolation (DTI) that penetrates through the semiconductor layer or a DTI that does not penetrate through the semiconductor layer. A metal may be embedded in the DTI to improve light shielding performance. The pixel separation portion 324 may be configured to surround the entire circumference of the photoelectric conversion element 102 in the planar view. Alternatively, the pixel separation portion 324 may be configured only at portions facing the sides of the photoelectric conversion element 102.

The distance from the pixel separation portion 324 of a certain pixel to the pixel separation portion 324 of an adjacent pixel or a pixel provided in the nearest position can be regarded as the size of one photoelectric conversion element 102. When one photoelectric conversion element 102 has a size L, a distance d from the light incidence surface to the avalanche multiplication region satisfies $L\sqrt{2}/4 < d < L*\sqrt{2}$. When the size and depth of the photoelectric conversion element 102 satisfy the relational expression, strength of the electric field in a depth direction is almost the same as strength of the electric field in a planar direction in the vicinity of the first semiconductor region 311. The above-described configuration can reduce variations in electric charge collection time, making it possible to reduce an occurrence of the timing jitter.

A pinning film 321, a planarization film 322, and a microlens 323 are further formed on the light incidence surface side of the semiconductor layer. A filter layer (not illustrated) may be further disposed on the light incidence surface side. Various types of optical filters such as a color filter, an infrared cut filter, and a monochromatic filter can be used as the filter layer. Examples of the color filter include a red, green, and blue (RGB) color filter and a red, green, blue, and white (RGBW) color filter.

The photoelectric conversion apparatus 100 according to the present exemplary embodiment is provided with a reflection member 326 having an opening 327 on the light incidence surface side of the semiconductor layer. The opening 327 is disposed to include the first semiconductor region 311 in the planar view perpendicular to the light incidence surface. Such a configuration scatters the incident light in the pixel to secure an optical path length larger than or equal to the thickness of the semiconductor layer. This enables photoelectric conversion of light having a longer wavelength, and at the same time, efficiently releasing avalanche emission light (described below) from of the semiconductor layer.

Figure 7:
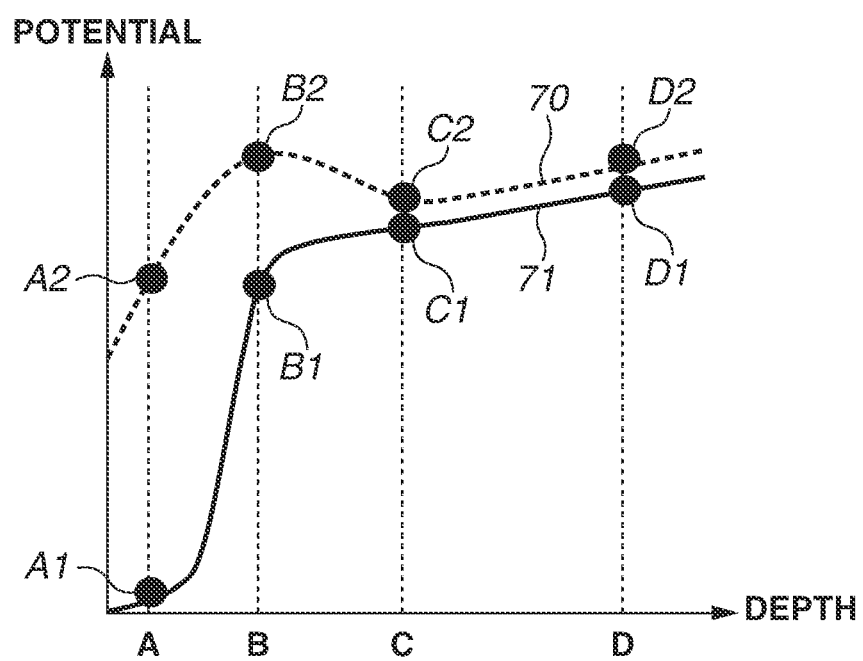
FIG. 7 illustrates a potential chart of the photoelectric conversion element according to the first exemplary embodiment.

FIG. 7 illustrates a potential chart of the photoelectric conversion element 102 illustrated in FIG. 6.

In FIG. 7, a dotted line 70 denotes a potential distribution along an FF' line in FIG. 6, and a solid line 71 denotes the potential distribution along an EE' line in FIG. 6. FIG. 7 illustrates the potential in terms of electrons, which are the main carrier electric charges of the N type semiconductor region. When the main carrier electric charges are holes, the relation between the potential height and the depth is reversed. Further, a depth A in FIG. 7 is equivalent to a height A in FIG. 6. Likewise, depths B, C, and D in FIG. 7 are equivalent to heights B, C, and D in FIG. 6, respectively.

In FIG. 7, at the depth A, the potential height corresponds to a level A1 on the solid line 71 and corresponds to a level A2 on the dotted line 70. At the depth B, the potential height corresponds to a level B1 on the solid line 71 and corresponds to a level B2 on the dotted line 70. At the depth C, the potential height corresponds to a level C1 on the solid line 71 and corresponds to a level C2 on the dotted line 70. At the depth D, the potential height corresponds to a level D1 on the solid line 71 and corresponds to a level on the dotted line 70.

In FIGS. 6 and 7, the potential height of the first semiconductor region 311 corresponds to the level A1, and the potential height in the vicinity of the center of the second semiconductor region 312 corresponds to the level B1. The potential height of the seventh semiconductor region 317 corresponds to the level A2, and the potential height of the outer periphery of the second semiconductor region 312 corresponds to the level B2.

With regard to the dotted line 70 in FIG. 7, the potential gradually decreases from the depth D to the depth C. Then, the potential gradually rises from the depth C to the depth B and then reaches the level B2 at the depth B. Further, the potential decreases from the depth B to the depth A and then falls to the level A2 at the depth A.

On the other hand, with regard to the solid line 71, the potential gradually decreases from the depth D to the depth C and from the depth C to the depth B, and then falls to the level B1 at the depth B. Then, the potential steeply decreases from the depth B to the depth A, and then falls to the level A1 at the depth A. At the depth D, the dotted line 70 and the solid line 71 are at substantially the same potential height, and have a potential gradient that gently decreases toward the second surface side of the semiconductor layer 301 in the regions indicated by the EE' and FF' lines. Therefore, electric charges generated in an optical detection apparatus move into the second surface side by the gentle potential gradient.

In the avalanche diode according to the present exemplary embodiment, the P-type second semiconductor region 312 has a lower impurity concentration than the N-type first semiconductor region 311, and the N-type first semiconductor region 311 and the P-type second semiconductor region 312 are supplied with such potentials that provide reverse biases. Accordingly, a depletion region is formed toward the side of the second semiconductor region 312. In this structure, the second semiconductor region 312 serves as a potential barrier against electric charges photoelectrically converted in the fourth semiconductor region 314, making it easier for electric charges to be collected in the first semiconductor region 311.

Although the second semiconductor region 312 is formed in the entire range of the photoelectric conversion element 102 in FIG. 6, the second semiconductor region 312 may be configured to be not provided in a portion overlapping the first semiconductor region 311 in the planar view, and a slit may be formed into which the fourth semiconductor region 314 extends. In this case, the potential difference between the second semiconductor region 312 and the slit lowers the potential in a direction from the FF' line to the EE' line at the depth C in FIG. 6. This enables electric charges to easily move toward the first semiconductor region 311 in a moving process of electric charges photoelectrically converted in the fourth semiconductor region 314. On the other hand, in the case where the second semiconductor region 312 is formed in the entire range of the photoelectric conversion element 102 as illustrated in FIG. 6, a voltage applied to obtain an intense electric field required for the avalanche multiplication can be lowered in comparison with the case where the slit is formed. This enables preventing noise due to formation of a local region with the intense electric field.

Electric charges having moved to the vicinity of the second semiconductor region 312 are subjected to the avalanche multiplication by being accelerated by the steep potential gradient, i.e., an intense electric field, ranging from the depth B to the depth A of the solid line 71 in FIG. 7.

On the other hand, in the region between the seventh semiconductor region 317 and the P-type second semiconductor region 312 in FIG. 6, i.e., in the range from the depth B to the depth A of the dotted line 70 in FIG. 7, the potential distribution does not cause the avalanche multiplication. Thus, electric charges generated in the fourth semiconductor region 314 can be counted as signal charges without increasing the area of the intense electric field region (avalanche multiplication region) relative to the size of the photodiode. The descriptions have been provided above on the premise that the conductivity type of the seventh semiconductor region 317 is the N-type, but the seventh semiconductor region 317 may be of the P-type as long as each impurity concentration satisfies the above-described potential relation.

Electric charges photoelectrically converted in the second semiconductor region 312 flow into the fourth semiconductor region 314 by the potential gradient ranging from the depth B to the depth C of the dotted line 70 in FIG. 7. The structure enables the electric charges in the fourth semiconductor region 314 to easily move into the second semiconductor region 312 for the above-described reasons. Thus, the electric charges photoelectrically converted in the second semiconductor region 312 move into the first semiconductor region 311 and are detected as signal charges through the avalanche multiplication. Therefore, the structure is provided with sensitivity to the electric charges photoelectrically converted in the second semiconductor region 312.

The dotted line 70 in FIG. 7 indicates the potential in the cross-section taken along the FF' line in FIG. 6. With regard to the dotted line 70, A2 denotes an intersection of the height A and the FF' line in FIG. 6, B2 denotes an intersection of the height B and the FF' line in FIG. 6, C2 denotes an intersection of the height C and the FF' line in FIG. 6, and D2 denotes an intersection of the height D and the FF' line in FIG. 6. The electrons photoelectrically converted in the fourth semiconductor region 314 in FIG. 6 move from the level D2 to the level C2 in FIG. 7. The range from the level C2 to the level B2 serves as a potential barrier for the electrons that cannot be gotten over thereby. Thus, the electrons move to the vicinity of the center of the fourth semiconductor region 314 in FIG. 6 indicated by the EE' line. The electrons having moved further move from the level C1 to the level B1 in FIG. 7, and are subjected to the avalanche multiplication by the steep potential gradient ranging from the level B1 to the level A1. Then, the electrons pass through the first semiconductor region 311 and then are detected as signal charges.

The electric charges generated in the vicinity of a boundary between the third semiconductor region 313 and the sixth semiconductor region 316 in FIG. 6 move along the potential gradient from the level B2 to the level C2 in FIG. 7. Then, as described above, the electric charges move to the vicinity of the center of the fourth semiconductor region 314 indicated by the EE' line in FIG. 6. Then, the electric charges are subjected to the avalanche multiplication along the steep potential gradient ranging from the level B1 to the level A1. Then, the electric charges having subjected to the avalanche multiplication pass through the first semiconductor region 311 and then are detected as signal charges.

Figure 8:
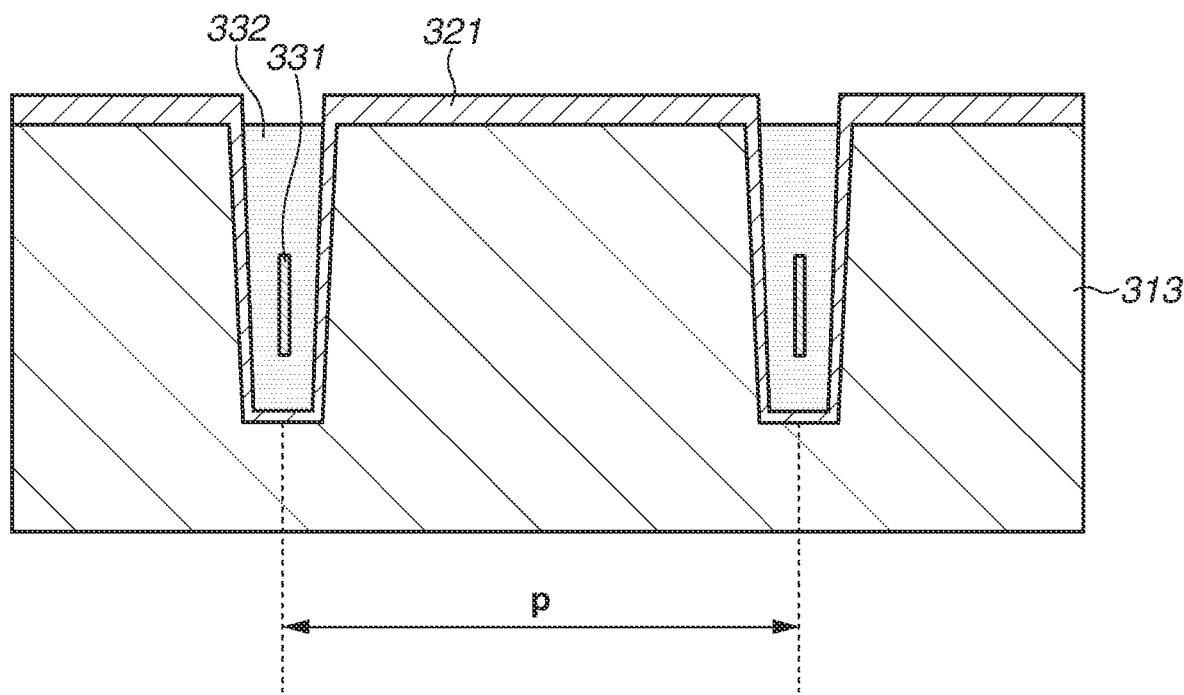
FIG. 8 is a cross-sectional view illustrating a trench structure of the photoelectric conversion element according to the first exemplary embodiment.

FIG. 8 is a cross-sectional view illustrating two of adjacent trench structures forming the uneven structure 325 of the photoelectric conversion apparatus 100 according to the first exemplary embodiment.

Each trench structure contains a different material from that in the third semiconductor region 313. For example, when the third semiconductor region 313 is made of silicon, the main component of the trench structure is formed of a silicone oxide film or a silicon nitride film, and may contain a metal or an organic material. A trench structure is formed at a depth of 0.1 to 0.6 µm from the surface of the semiconductor layer. To sufficiently enhance diffraction of the incident light, it is desirable that the depth of the trench structure is larger than the width of the trench structure. The width of the trench structure refers to the width from one interface between the pinning film 321 and the third semiconductor region 313 to another interface between the pinning film 321 and the third semiconductor region 313 in a plane passing through the center of gravity of a trench cross section. The depth of the trench structure refers to the depth from the light incidence surface to the bottom of the trench structure.

A pitch p indicated by the arrow represents one pitch of the uneven structure 325 constituted of a plurality of trench structures in FIG. 8. A distance from the center of gravity of one trench structure in the uneven structure 325 to the center of gravity of another trench structure adjacent to the trench structure in the cross section is referred to as the pitch of the uneven structure 325, and an average of the pitches of projections or depressions of the entire uneven structure 325 is referred to as an effective pitch.

A trench forming process will be described below. Firstly, a groove is formed on the third semiconductor region 313 of the semiconductor layer by etching. Then, the pinning film 321 is formed on the surface of the third semiconductor region 313 and inside the trench structure by, for example, chemical vapor deposition. The inside of the trench structure covered with the pinning film 321 is filled with a filling member 332. The trench structure forming the uneven structure 325 can be filled by the same process as that for a trench constituting the pixel separation portion. In this case, a side wall portion of the trench structure forming the uneven structure 325 and a side wall portion of the trench structure forming the pixel separation portion have an equivalent impurity concentration.

The filling member 332 may contain a cavity 331. Since the refraction index of the cavity 331 is lower than the refraction index of the filling member 332, an optical path difference occurs between light that passed through the cavity 331 and light that passed through other portions. In comparison with a case where no cavity is provided inside the filling member 332, the refraction index difference of the entire uneven structure 325 increases to increase the phase difference occurring in the light that penetrated through the uneven structure 325, making it easier to strengthen the diffraction of the incident light. More specifically, a cavity in the filling member 332 increases the intensity of incident light in a particular phase, and thus an effect of improving the sensitivity can be obtained.

Figure 9A:
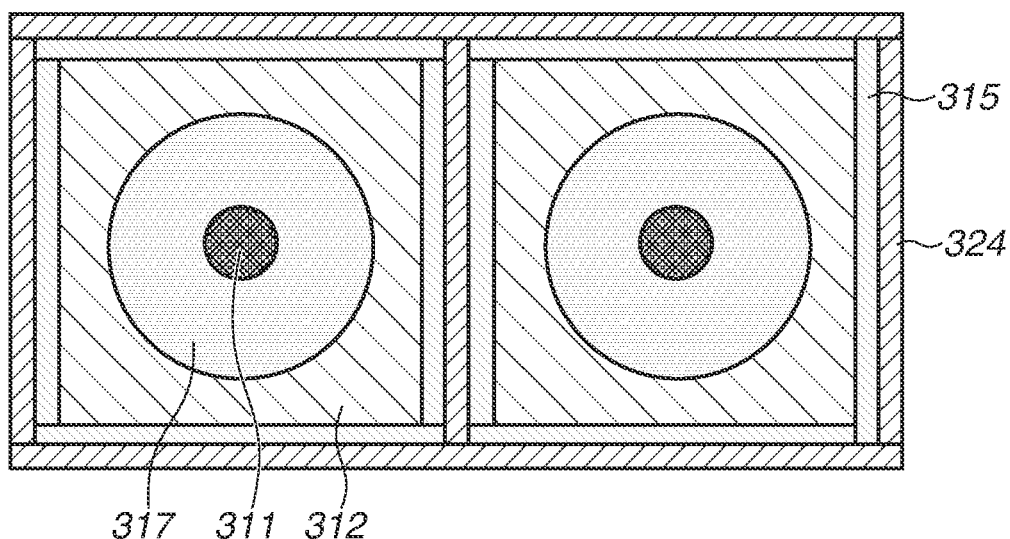
FIGS. 9A and 9B are plan views illustrating the photoelectric conversion element according to the first exemplary embodiment.
Figure 9B:
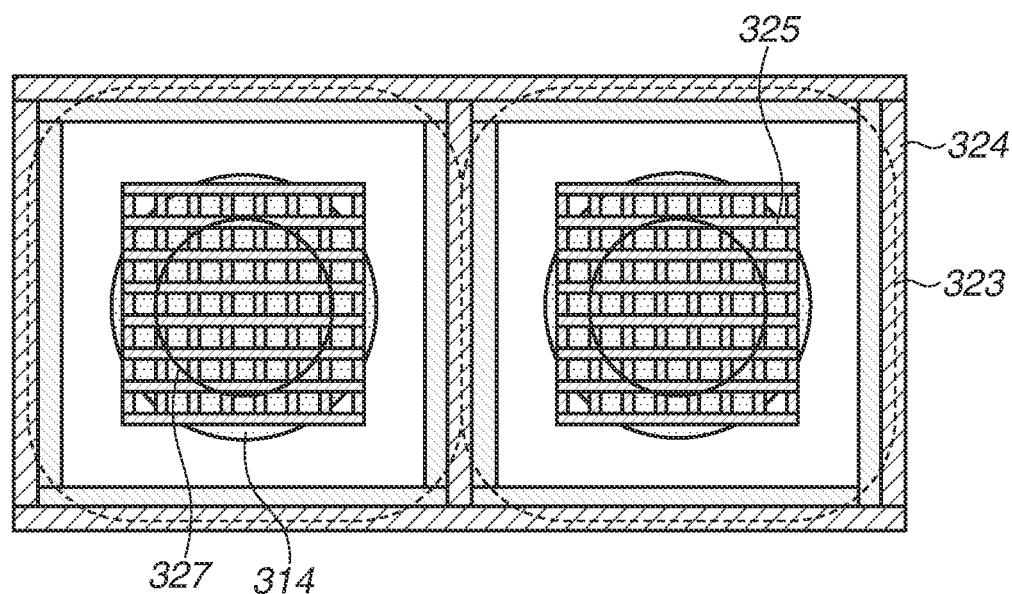

FIGS. 9A and 9B are plan views illustrating two adjacent pixels of the photoelectric conversion apparatus 100 according to the first exemplary embodiment. FIG. 9A is a plan view in the planar view from a surface facing the light incidence surface, and FIG. 9B is a plan view in the planar view from the light incidence surface side.

In FIG. 9A, the first semiconductor region 311, the fourth semiconductor region 314, and the seventh semiconductor region 317 are circularly shaped and concentrically disposed. Such structure brings about an effect of suppressing the local electric field concentration at the end of the intense electric field region between the first semiconductor region 311 and the second semiconductor region 312 and reducing the DCR. The shape of each of the semiconductor regions is not limited to a circle but may be a polygon having the same position of the center of gravity.

In FIG. 9B, the uneven structure 325 is formed in a lattice form in the planar view. The uneven structure 325 is formed to be overlapping the first semiconductor region 311 and the fourth semiconductor region 314. The center of gravity of the uneven structure 325 is included in the avalanche multiplication region in the planar view. In the trench structure in a lattice form illustrated in FIG. 9B, a trench depth at an intersection of trench structures is larger than the trench depth of a portion where a single trench structure extends. However, the bottom of the trench structures at the intersection thereof is positioned close to the light incidence surface side relative to a half of the thickness of the semiconductor layer. The trench depth refers to the depth from the second surface to the bottom, and also refers to the depth of a recessed portion of the uneven structure 325.

Figure 10:
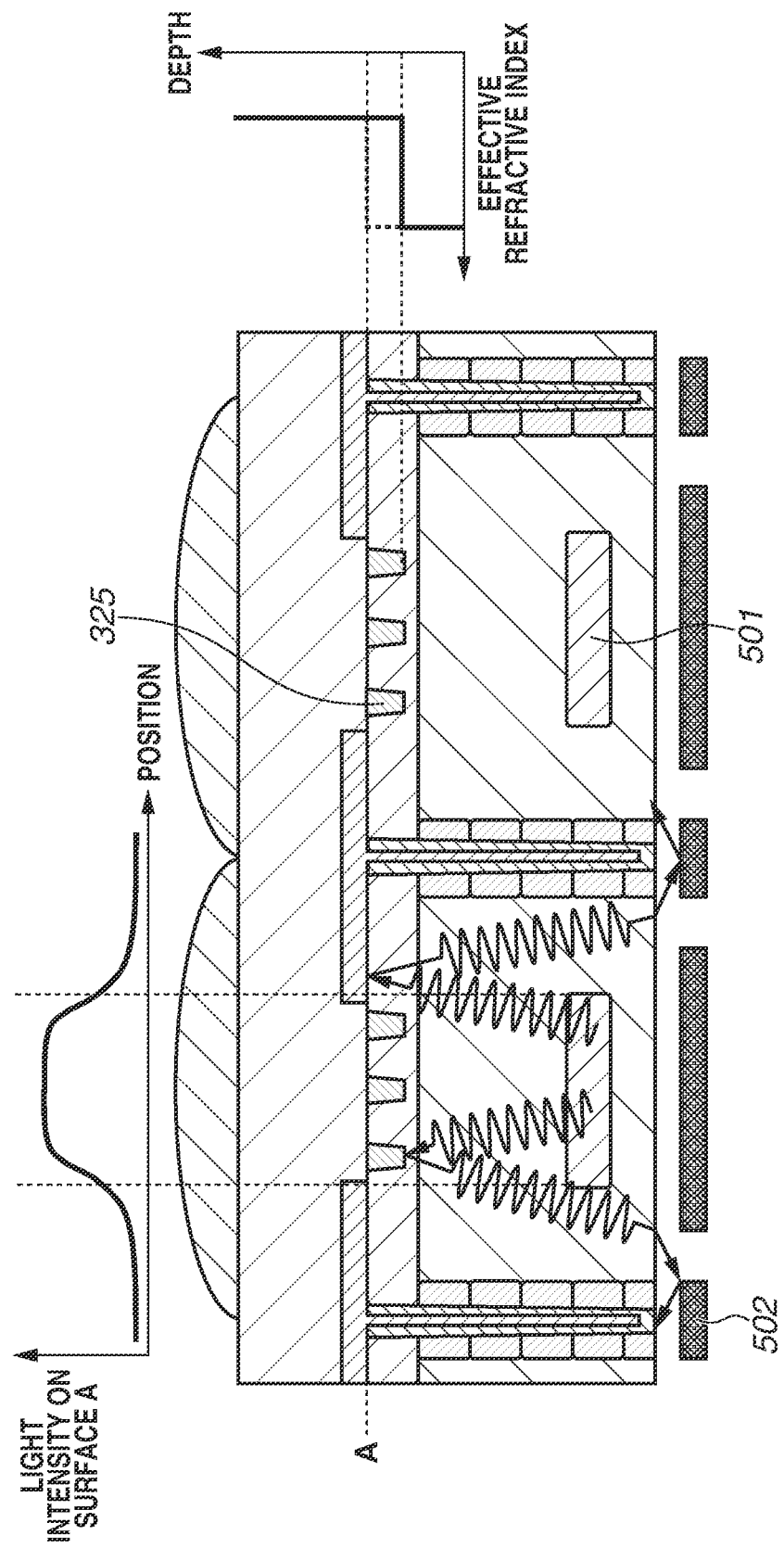
FIG. 10 illustrates a comparative example of the photoelectric conversion element according to the first exemplary embodiment.

FIG. 10 illustrates a comparative example of the photoelectric conversion element 102 according to the first exemplary embodiment. FIG. 10 illustrates the photoelectric conversion element 102 in a simplified way. The photoelectric conversion element 102 includes an avalanche multiplication region 501, a wiring layer 502, and the uneven structure 325.

When light is incident on such a photoelectric conversion element 102, an avalanche light emission may occur in the avalanche multiplication region 501. The avalanche light emission refers to a phenomenon in which a large number of electrons or halls generated by the avalanche multiplication recombine with electric charges having a different polarity to generate photons. When photons resulting from the avalanche light emission leak into an adjacent pixel, a pseudo signal occurs, which may possibly degrading image quality.

With the photoelectric conversion element 102 illustrated in FIG. 10, the effective pitch of the uneven structure 325 formed on the light incidence surface side of the semiconductor layer is larger than the wavelength of avalanche emission light. The spectrum of the avalanche emission light has a wide wavelength to some extent ranging from the short to long wavelengths. Since components with a shorter wavelength have a shorter absorption length in the substrate and are photoelectrically converted at a position closer to a light emitting region, there is a lower probability that light reaches the adjacent pixel and produces the pseudo signal. On the other hand, since components with a longer wavelength have a longer absorption length in the substrate, there is a higher probability that the pseudo signal occurs at a position further from the light emitting region. Thus, such components may be a dominant factor of image quality degradation. Thus, a component having the maximum wavelength of the spectrum of the avalanche emission light can be approximately recognized as a representative factor of the image quality degradation. The maximal value of the wavelength of the avalanche light emission is determined by the band gap of a substrate material, and can be calculated by $hc/E_a$, where h denotes Planck's constant [J·s], c denotes the velocity of light [m/s], and $E_a$ denotes the band gap [J] of the substrate. For example, if the sensor substrate 11 is made of silicon, the maximal value of the wavelength of the avalanche emission light is around 1.1 μm.

When the effective pitch of the uneven structure 325 is larger than the wavelength of the avalanche emission light, the avalanche emission light behaves as a particle relative to the uneven structure 325. Since the change of the effective refractive index becomes steep with respect to the depth of the semiconductor layer, the avalanche emission light is reflected by the bottom of the uneven structure 325, and the reflected light becomes stray light in the pixel.

Figure 11:
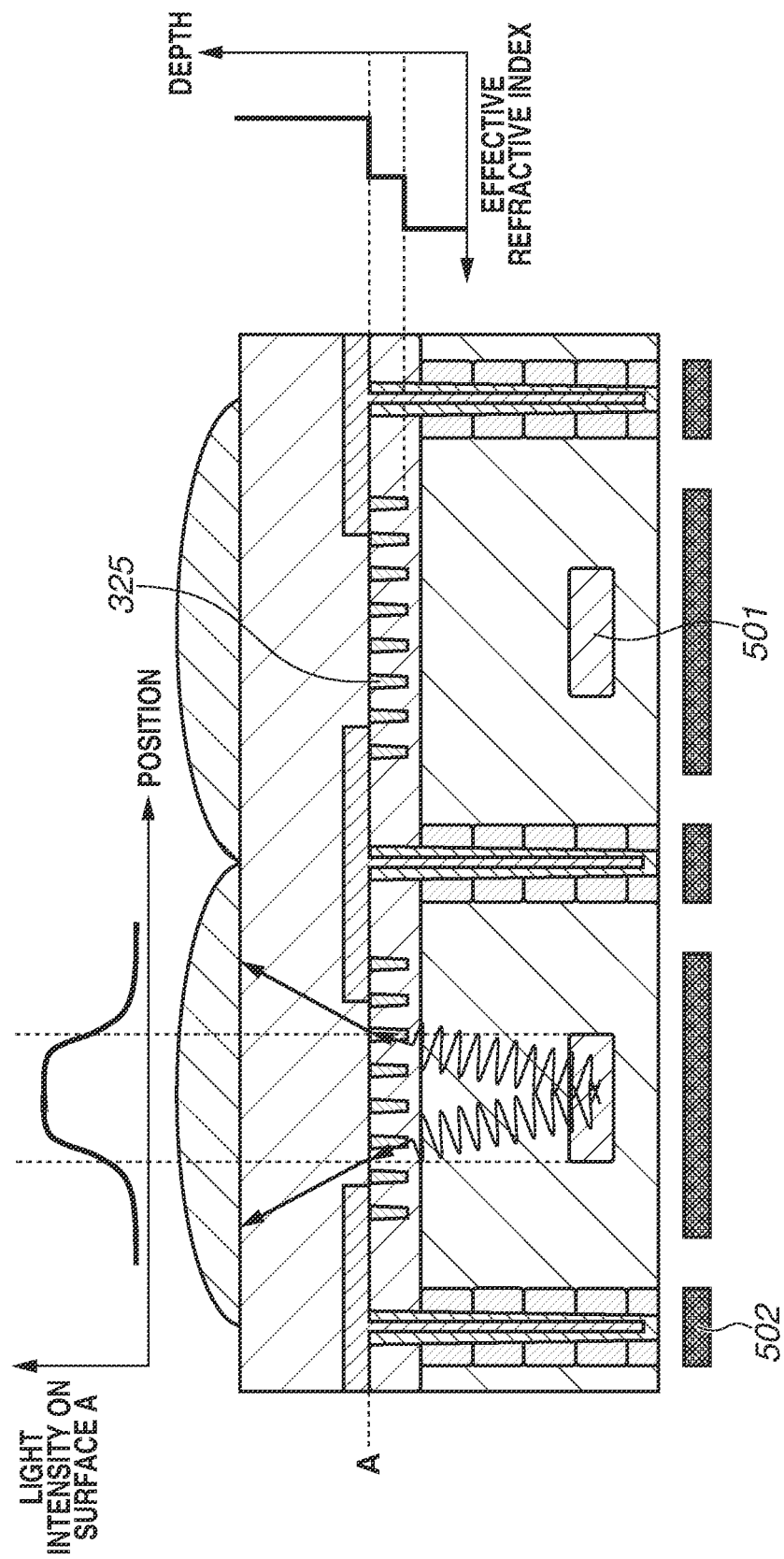
FIG. 11 is a cross-sectional view illustrating the photoelectric conversion element according to the first exemplary embodiment.

FIG. 11 illustrates the photoelectric conversion apparatus 100 according to the first exemplary embodiment. Similar to FIG. 10, FIG. 11 illustrates the photoelectric conversion element 102 in a simplified way.

In the photoelectric conversion element 102 illustrated in FIG. 11, the pitch of the uneven structure 325 formed on the light incidence surface side of the semiconductor layer is smaller than the wavelength of the avalanche emission light. In a case where the sensor substrate 11 is made of silicon, the uneven structure 325 is formed with a pitch of 1.1 to 0.2 μm. If the avalanche light emission occurs in such a photoelectric conversion element 102, the avalanche emission light behaves as a wave. In this case, since the change of the effective refractive index becomes gentle with respect to the depth of the substrate, a small amount of the avalanche emission light is reflected by the bottom of the uneven structure 325, and the avalanche emission light incident on the uneven structure 325 advances toward outside of the substrate, thereby stray light in the pixel is restricted. In this case, an effect of more effectively restricting stray light can be obtained by the uneven structure 325 being disposed at the center of the photoelectric conversion element 102 where the avalanche emission light has high light intensity on the light incidence surface of the semiconductor layer.

The avalanche multiplication region 501 of the photoelectric conversion element 102 illustrated in FIG. 11 is smaller than that of the photoelectric conversion element 102 illustrated in FIG. 10. As described above with reference to FIG. 7, the structure enables the electric charge generated by photoelectric conversion to be counted as signal charges without increasing the area of the avalanche multiplication region 501 with respect to the size of the photodiode. Decreasing the area of the avalanche multiplication region 501 decreases the range where the avalanche emission light can occur, making it easier to release the avalanche emission light from the opening overlapping the avalanche multiplication region 501 in the planar view.

An example of the trench structure that forms the uneven structure 325 illustrated in FIG. 11 is tapered and has no fixed width. Such an uneven structure enables obtaining the effect of the present application as long as an average width (the width at a half of the trench depth in FIG. 11) in the cross-section structure is smaller than the wavelength of the avalanche emission light. In other words, the width of the trench structure satisfies $hc/2E_a$ where h denotes Planck's constant [J·s], c denotes the velocity of light [m/s], and $E_a$ denotes the band gap [J] of the substrate. For example, the width of the trench structure in the sensor substrate 11 made of silicon is 0.55 μm or less. It can be said that the effective pitch is smaller than the wavelength with which the optical absorption length of the semiconductor substrate is equal to the distance from the light incidence surface to the interface between the first and second semiconductor regions.

The wiring layer 502 including aluminum (AL) wiring functions as a reflection member that reflects the light that penetrated through the semiconductor layer 301 to the inside of the pixel.

By providing such a reflection member having an opening and including an electric charge collection portion in a planar view, it becomes possible not only to scatter the incident light to secure an optical path length but also to effectively release the avalanche emission light from the semiconductor layer 301 to reduce crosstalk.

A photoelectric conversion apparatus 100 according to a second exemplary embodiment will be described below with reference to FIGS. 12, 13A, and 13B.

Descriptions the same as those in the first exemplary embodiment will be omitted, and differences from the first exemplary embodiment will be mainly described below. In the second exemplary embodiment, a waveguide structure is provided on the light incidence surface side of the photoelectric conversion apparatus 100.

Figure 12:
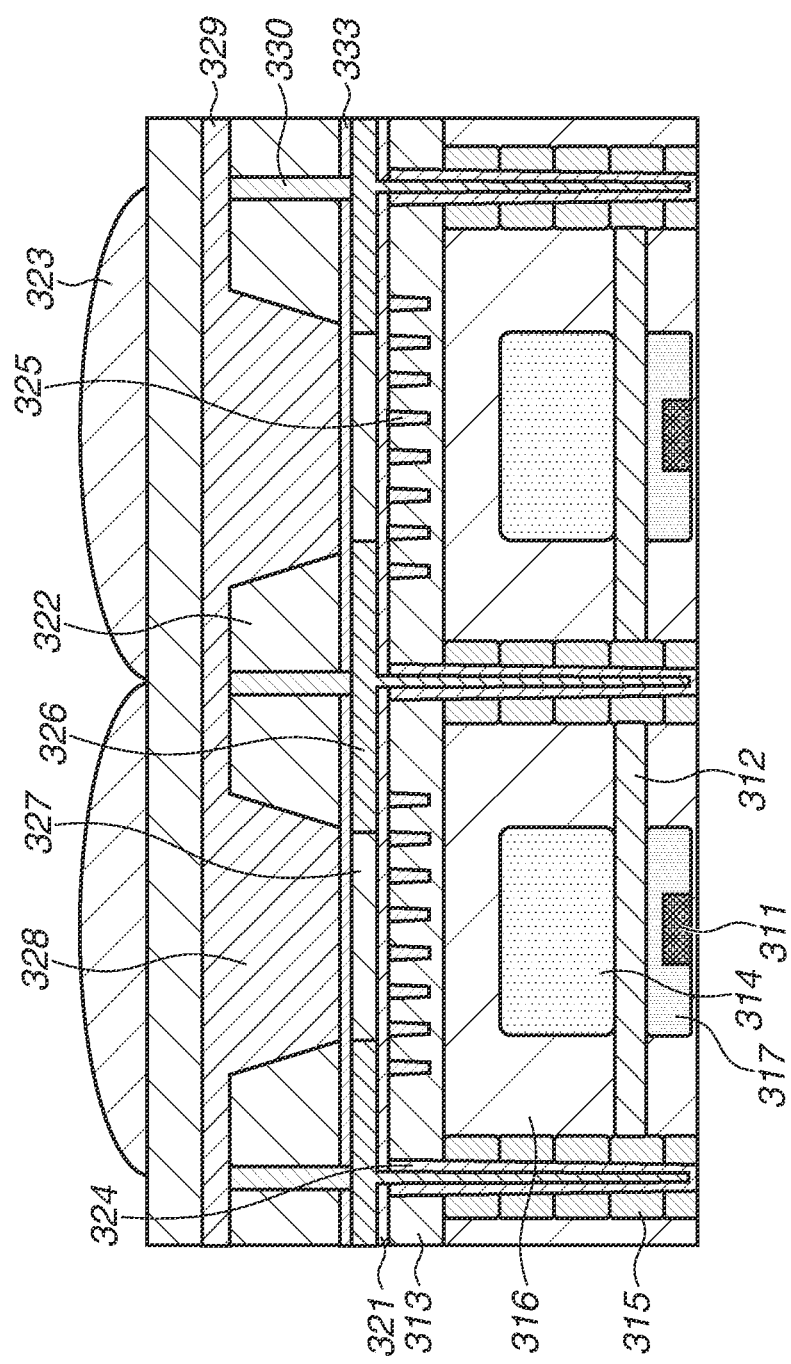
FIG. 12 is a cross-sectional view illustrating a photoelectric conversion element according to a second exemplary embodiment.
Figure 13A:
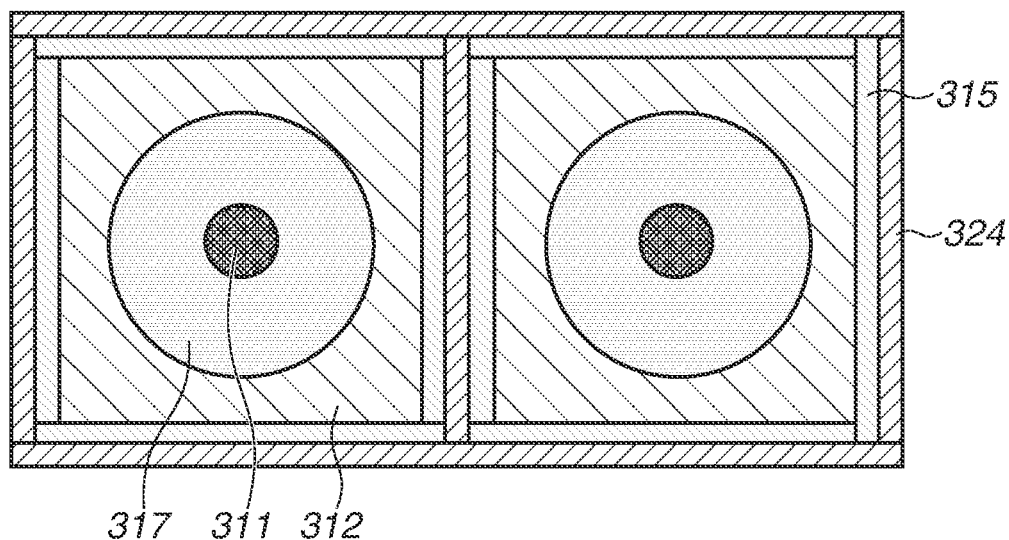
FIGS. 13A and 13B are plan views illustrating the photoelectric conversion element according to the second exemplary embodiment.
Figure 13B:
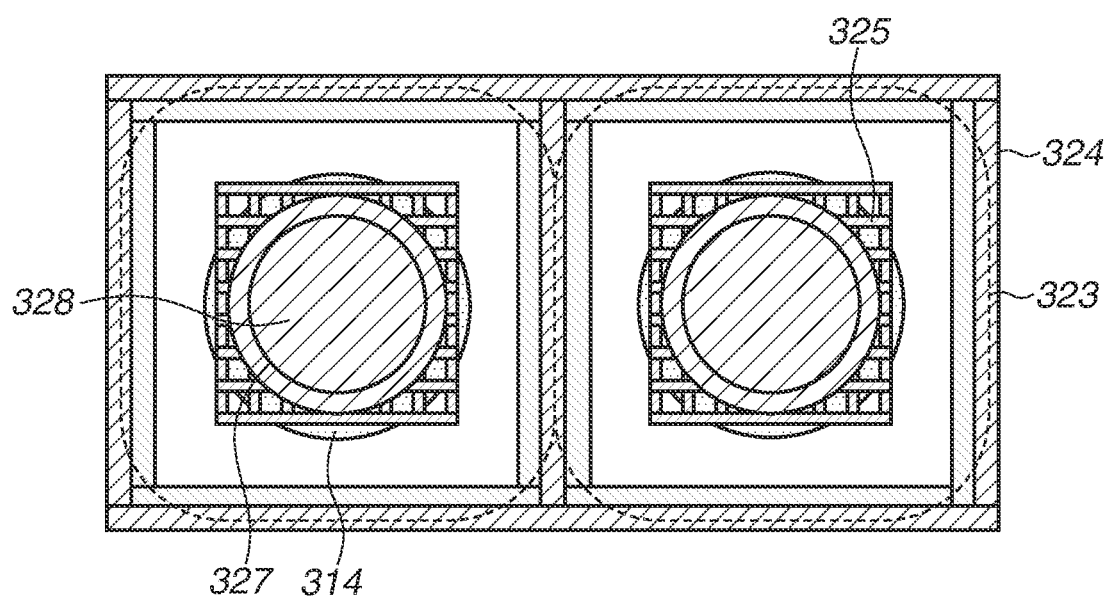

FIG. 12 is a cross-sectional view illustrating two adjacent pixels of the photoelectric conversion apparatus 100 according to the second exemplary embodiment. FIGS. 13A and 13B are plan views illustrating the two pixels.

A stopper film 333 is formed on the reflection member 326 formed on the light incidence surface side of the semiconductor layer 301. A waveguide 328 is provided in a region overlapping the opening 327 in the planarization film 322 formed on the stopper film 333.

The planarization film 322 is made of, for example, silicon monoxide (SiO). The waveguide 328 is made of a material having a higher refraction index of light than that of the planarization film 322, such as silicon nitride (SiN) or silicon oxynitride (SiON). The waveguide 328 is formed by filling a groove formed in the planarization film 322 by etching with a waveguide material. The stopper film 333 formed on the reflection member 326 prevents an etching damage from entering the semiconductor layer 301.

The waveguide 328 provided on the light incidence surface side increases condensing efficiency of light onto the opening 327, improving a photon detection efficiency (PDE). The condensing efficiency of light onto the opening 327 can be further improved by configuring an upper surface of the tapered waveguide 328 to include the opening 327 of the reflection member 326.

Figure 14:
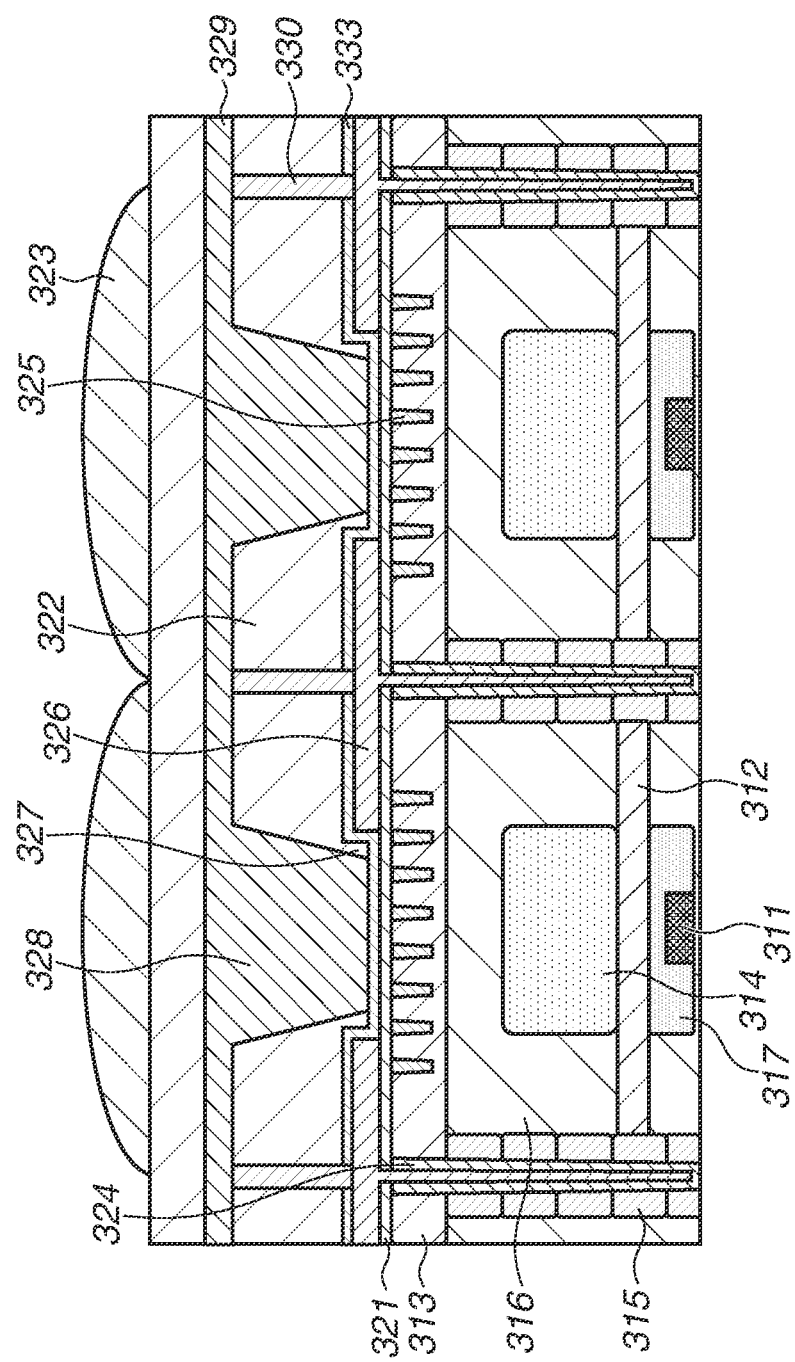
FIG. 14 is a cross-sectional view illustrating a photoelectric conversion element according to a modification of the second exemplary embodiment.
Figure 15A:
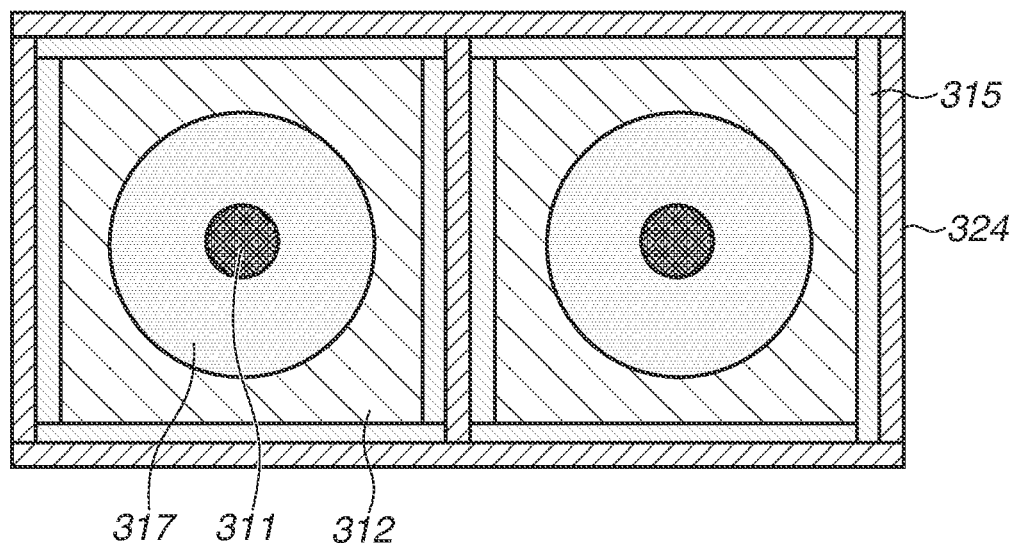
FIGS. 15A and 15B are plan views illustrating the photoelectric conversion element according to the modification of the second exemplary embodiment.
Figure 15B:
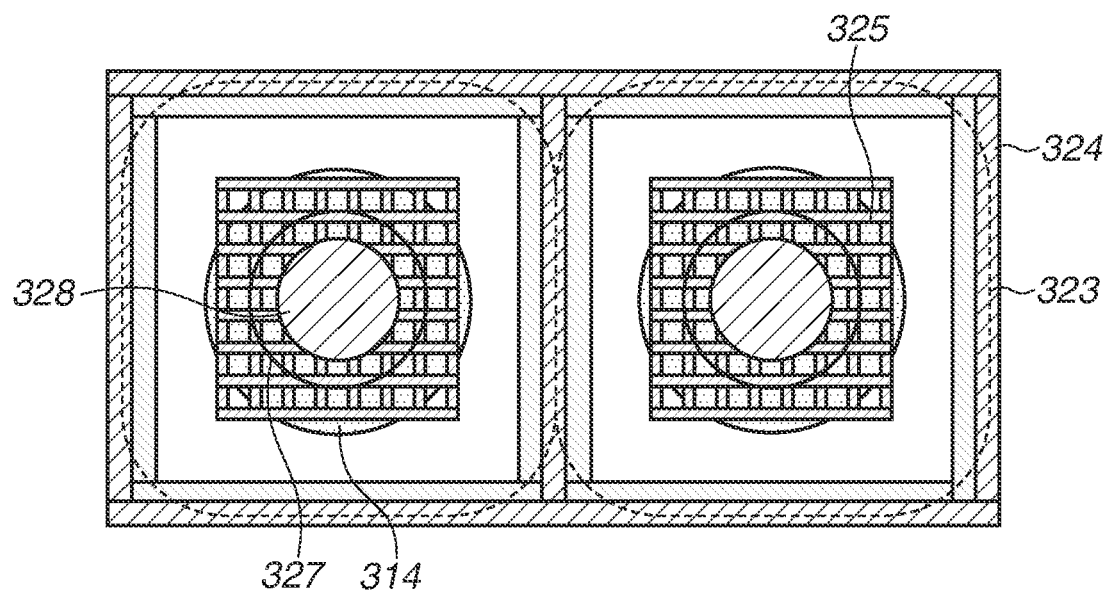

FIG. 14 is a plan view illustrating two adjacent pixels of the photoelectric conversion apparatus 100 according to a modification of the second exemplary embodiment. FIGS. 15A and 15B are plan views illustrating the two pixels.

In the photoelectric conversion apparatus 100 illustrated in FIG. 12, the stopper film 333 is formed in parallel with an upper surface of the reflection member 326. In the photoelectric conversion apparatus 100 illustrated in FIG. 14, the stopper film 333 is formed along an outer shape of the reflection member 326, and a lower surface of the waveguide 328 extends to a position close to the light incidence surface of the semiconductor layer 301 relative to the upper surface of the reflection member 326. The configuration enables further improvement of the condensing efficiency of light onto the opening 327 by the waveguide 328.

A photoelectric conversion apparatus 100 according to a third exemplary embodiment will be described below with reference to FIGS. 16, 17A, and 17B.

Descriptions the same as those in the first and second exemplary embodiments will be omitted, and differences from the first exemplary embodiment will be mainly described below.

Figure 16:
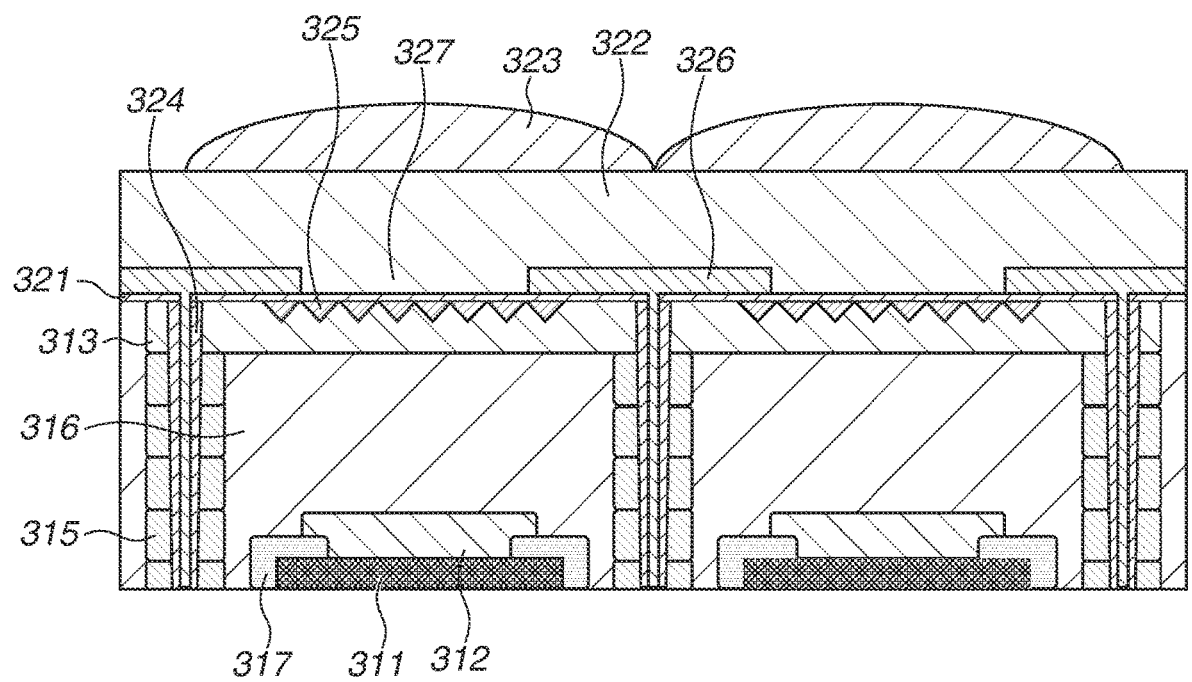
FIG. 16 is a cross-sectional view illustrating a photoelectric conversion element according to a third exemplary embodiment.

FIG. 16 is a cross-sectional view illustrating the photoelectric conversion element 102 of the photoelectric conversion apparatus 100 according to the third exemplary embodiment taken along a direction perpendicular to the planar direction of the substrate. In the photoelectric conversion apparatus 100 according to the present exemplary embodiment, the ratio of the N-type first semiconductor region 311 to the light-receiving surface of the pixel is larger than that in the photoelectric conversion apparatus 100 according to the first exemplary embodiment. The seventh semiconductor region 317 is disposed between the first semiconductor region 311 and the second semiconductor region 312.

The uneven structure 325 has a shape of a four-sided pyramid the cross section of which is a triangle having the light incidence surface as the base.

Figure 17A:
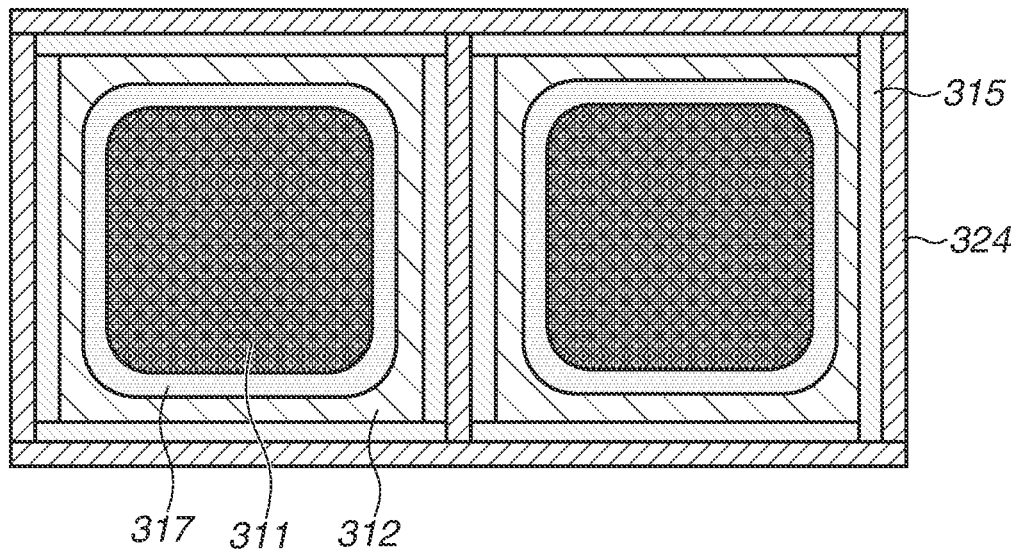
FIGS. 17A and 17B are plan views illustrating the photoelectric conversion element according to the third exemplary embodiment.
Figure 17B:
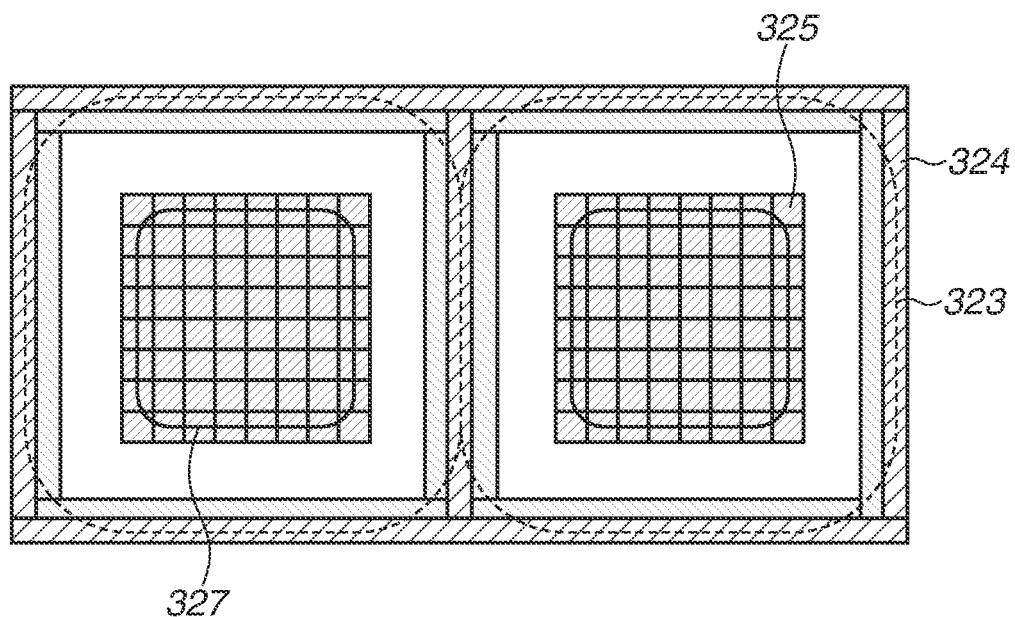

FIGS. 17A and 17B are plan views illustrating two adjacent pixels of the photoelectric conversion apparatus 100 according to the third exemplary embodiment. FIG. 17A is a plan view in the planar view from a surface facing the light incidence surface, and FIG. 17B is a plan view in the planar view from the light incidence surface side.

In the planar view from the light incidence surface side, the third semiconductor region 313 is disposed between the first semiconductor region 311 and the second semiconductor region 312. The incident light is subjected to the avalanche multiplication between the first semiconductor region 311 and the second semiconductor region 312. Thus, when the opening of the pixel is designed so that the first semiconductor region 311 and the second semiconductor region 312 are exposed to light, an opening ratio of the photoelectric conversion apparatus 100 according to the present exemplary embodiment is smaller than that of the photoelectric conversion apparatus 100 according to the first and second exemplary embodiments. The reduced opening ratio enables reduction of the volume of the photoelectric conversion region subjected to signal detection, making it possible to reduce crosstalk.

According to the present exemplary embodiment, the first semiconductor region 311 is included in the opening 327 in the planar view, making it possible to obtain an effect of PDE improvement by the improved light condensing efficiency.

Figure 18:
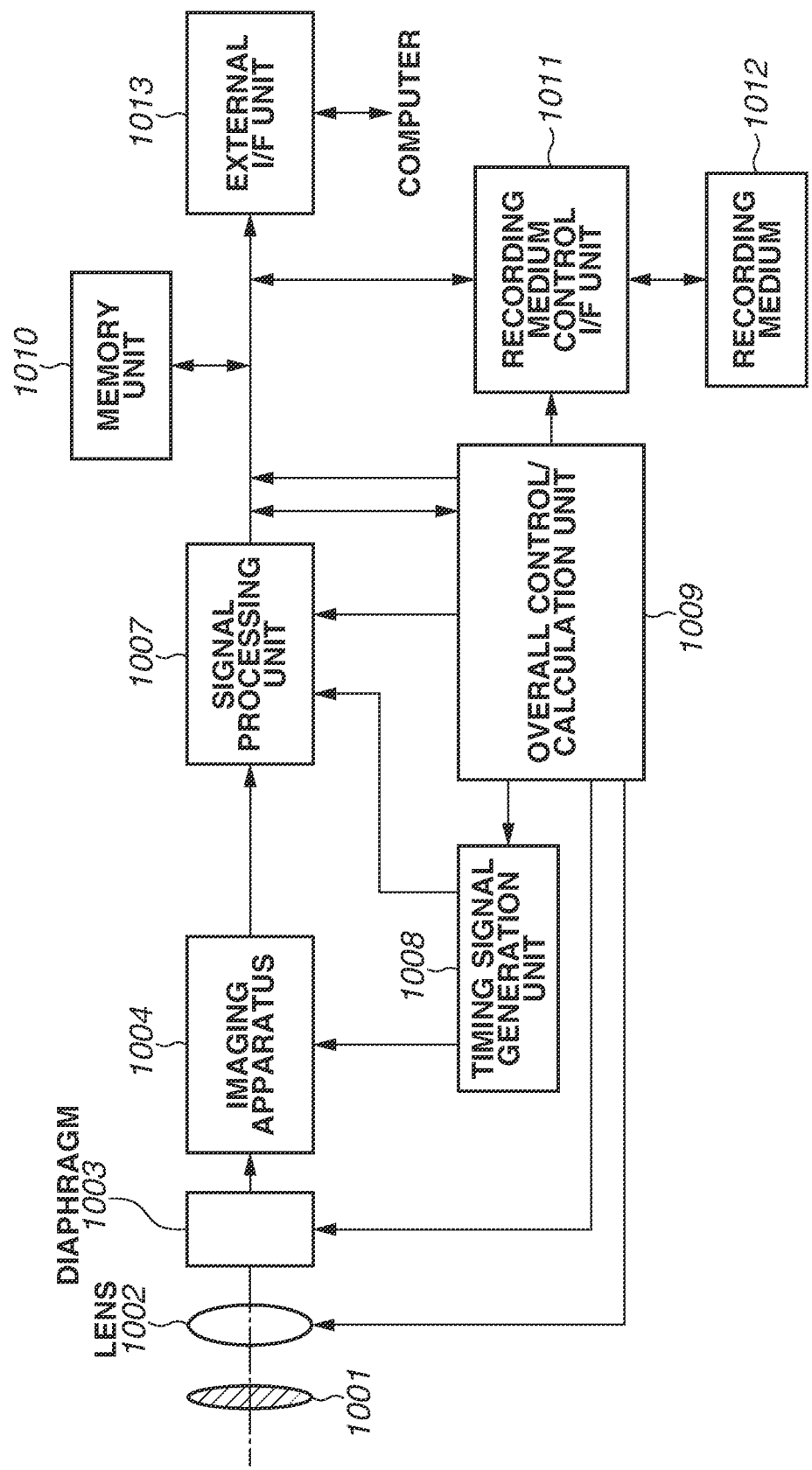
FIG. 18 is a function block diagram illustrating a photoelectric conversion system according to a fourth exemplary embodiment.

A photoelectric conversion system according to a fourth exemplary embodiment will be described below with reference to FIG. 18. FIG. 18 is a block diagram schematically illustrating a configuration of the photoelectric conversion system according to the fourth exemplary embodiment.

The photoelectric conversion apparatuses 100 according to the first to third exemplary embodiments are applicable to various types of photoelectric conversion system. Examples of the applicable photoelectric conversion system include a digital still camera, a digital camcorder, a monitoring camera, a copying machine, a facsimile, a portable telephone, an on-vehicle camera, and an observation satellite. A camera module including an optical system such as a lens and an imaging apparatus is also an example of the photoelectric conversion system. FIG. 18 is a block diagram illustrating a digital still camera as an example of the photoelectric conversion system.

An example of the photoelectric conversion system illustrated in FIG. 18 includes an imaging apparatus 1004 that is an example of a photoelectric conversion apparatus 100, and a lens 1002 that forms an optical image of a subject on the imaging apparatus 1004. The photoelectric conversion system further includes a diaphragm 1003 that changes a light quantity passing through the lens 1002, and a barrier 1001 that protects the lens 1002. The lens 1002 and the diaphragm 1003 constitute an optical system that condenses light onto the imaging apparatus 1004. The imaging apparatus 1004 is the photoelectric conversion apparatus 100 according to any one of the above-described exemplary embodiments, and converts the optical image formed by the lens 1002 into an electrical signal.

The photoelectric conversion system further includes a signal processing unit or circuit 1007 that is an image generation unit or circuit that generates an image by processing the output signal output from the imaging apparatus 1004. The signal processing unit or circuit 1007 performs various correction and compression as necessary and operates to output image data. The signal processing unit or circuit 1007 may be formed on a semiconductor substrate on which the imaging apparatus 1004 is provided, or on a semiconductor substrate different from the substrate on which the imaging apparatus 1004 is provided.

The photoelectric conversion system further includes a memory unit or circuit 1010 that temporarily stores image data, and an external interface (I/F) unit or circuit 1013 used to communicate with an external computer. The photoelectric conversion system further includes a recording medium 1012, such as a semiconductor memory, used to record and read imaging data, and a recording medium control I/F unit or circuit 1011 used to record and read imaging data to and from the recording medium 1012. The recording medium 1012 may be built in the photoelectric conversion system, or may be attachable to and detachable from the photoelectric conversion system.

The photoelectric conversion system further includes an overall control/calculation unit or circuit 1009 that performs various calculations and controls the entire digital still camera, and a timing signal generation unit 1008 that outputs various timing signals to the imaging apparatus 1004 and the signal processing unit or circuit 1007. The timing signals may be input from the outside. The photoelectric conversion system needs to include at least the imaging apparatus 1004 and the signal processing unit or circuit 1007 that processes the output signal output from the imaging apparatus 1004.

The imaging apparatus 1004 outputs an image capture signal to the signal processing unit or circuit 1007. The signal processing unit or circuit 1007 subjects the image capture signal output from the imaging apparatus 1004 to predetermined signal processing, and outputs image data. The signal processing unit or circuit 1007 generates an image by using the image capture signal.

The present exemplary embodiment makes it possible to implement the photoelectric conversion system to which the photoelectric conversion apparatus 100 (imaging apparatus) according to one of the above-described exemplary embodiments is applied.

Figure 19A:
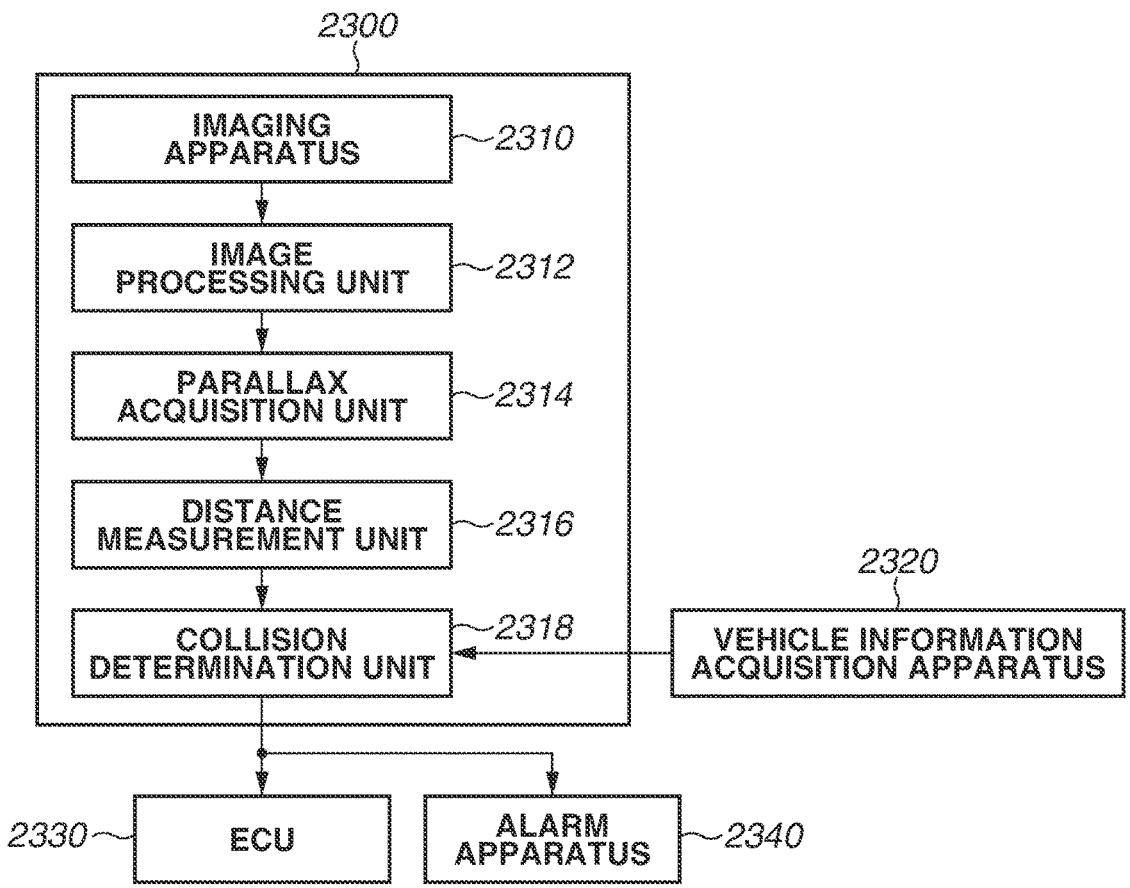
FIGS. 19A and 19B are function block diagrams illustrating a photoelectric conversion system according to a fifth exemplary embodiment.
Figure 19B:
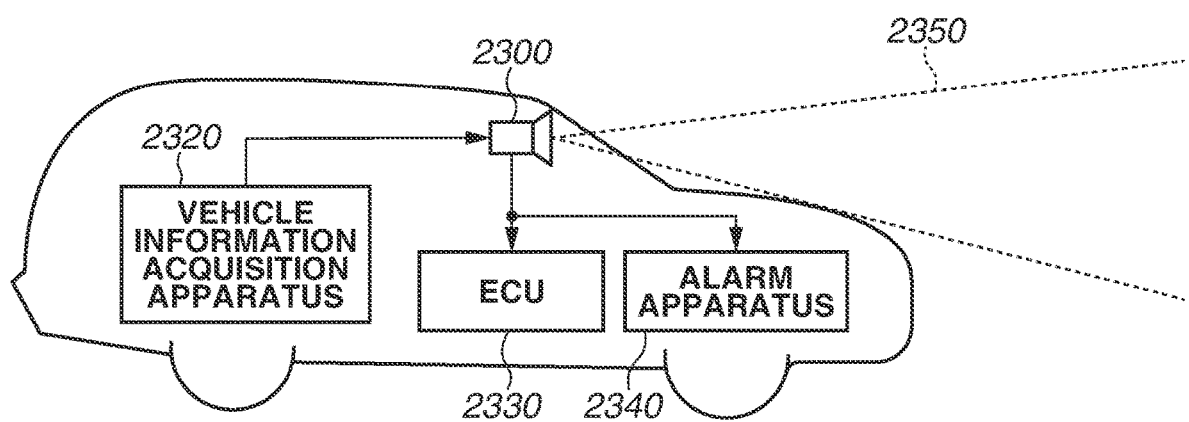

A photoelectric conversion system and a moving body according to a fifth exemplary embodiment will be described below with reference to FIGS. 19A and 19B. FIGS. 19A and 19B illustrate configurations of the photoelectric conversion system and the moving body, respectively, according to the fifth exemplary embodiment.

FIG. 19A illustrates an example of a photoelectric conversion system related to an on-vehicle camera. A photoelectric conversion system 2300 includes an imaging apparatus 2310. The imaging apparatus 2310 is the photoelectric conversion apparatus 100 according to one of the above-described exemplary embodiments. The photoelectric conversion system 2300 includes an image processing unit or circuit 2312 that performs image processing on a plurality of pieces of image data acquired by the photoelectric conversion system 2300, and a parallax acquisition unit or circuit 2314 that calculates parallax (phase difference of a parallax image) based on the plurality of pieces of image data acquired by the imaging apparatus 2310. The photoelectric conversion system 2300 further includes a distance acquisition unit or circuit 2316 that calculates a distance to a target object based on the calculated parallax, and a collision determination unit or circuit 2318 that determines the possibility of collision based on the calculated distance. The parallax acquisition unit or circuit 2314 and the distance acquisition unit or circuit 2316 are examples of distance information acquisition unit or circuit for acquiring information about the distance to the target object. More specifically, distance information includes information about the parallax, the defocus amount, and the distance to the target object. The collision determination unit or circuit 2318 may determine the possibility of collision by using one of these pieces of distance information. The distance information acquisition unit may be implemented by exclusively-designed hardware components or implemented by software modules.

The distance information acquisition units may also be implemented by a field programmable gate array (FPGA), an application specific integrated circuit (ASIC), or a combination of both.

The photoelectric conversion system 2300 is connected with a vehicle information acquisition apparatus 2320 to acquire vehicle information such as a vehicle speed, yaw rate, and steering angle. The photoelectric conversion system 2300 is connected with an electronic control unit (ECU) 2330 that is a control apparatus that outputs a control signal to generate a braking force on a vehicle based on a determination result by the collision determination unit or circuit 2318. The photoelectric conversion system 2300 is also connected with a warning apparatus 2340 that issues an alarm to a driver based on the determination result by the collision determination unit or circuit 2318. For example, if the possibility of collision is high based on the determination result by the collision determination unit or circuit 2318, the ECU 2330 performs vehicle control to avoid a collision and reduce damages, for example, by applying brakes, releasing the gas pedal, or reducing the engine power. The warning apparatus 2340 warns the driver by sounding an alarm, displaying alarm information on a screen of a car navigation system, or applying a vibration to a seat belt or steering wheel.

In the present exemplary embodiment, the photoelectric conversion system 2300 captures images of the surrounding of the vehicle, for example, images ahead or behind the vehicle. FIG. 19B illustrates a photoelectric conversion system that captures images ahead of the vehicle (imaging range 2350). The vehicle information acquisition apparatus 2320 transmits an instruction to the photoelectric conversion system 2300 or the imaging apparatus 2310. The above-described configuration enables improvement of accuracy of distance measurement.

Although the present exemplary embodiment has been described above centering on control for avoiding a collision with another vehicle, the present exemplary embodiment is also applicable to automated driving control to follow another vehicle and automated driving control to prevent the vehicle from drifting from the lane. The photoelectric conversion system is applicable not only to vehicles such as an automobile but also to moving bodies (moving apparatuses) such as a vessel, an airplane, and an industrial robot. In addition, the photoelectric conversion system is applicable not only to the moving bodies but also to the intelligent transport systems (ITS) and a wide range of apparatuses utilizing object recognition.

Figure 20:
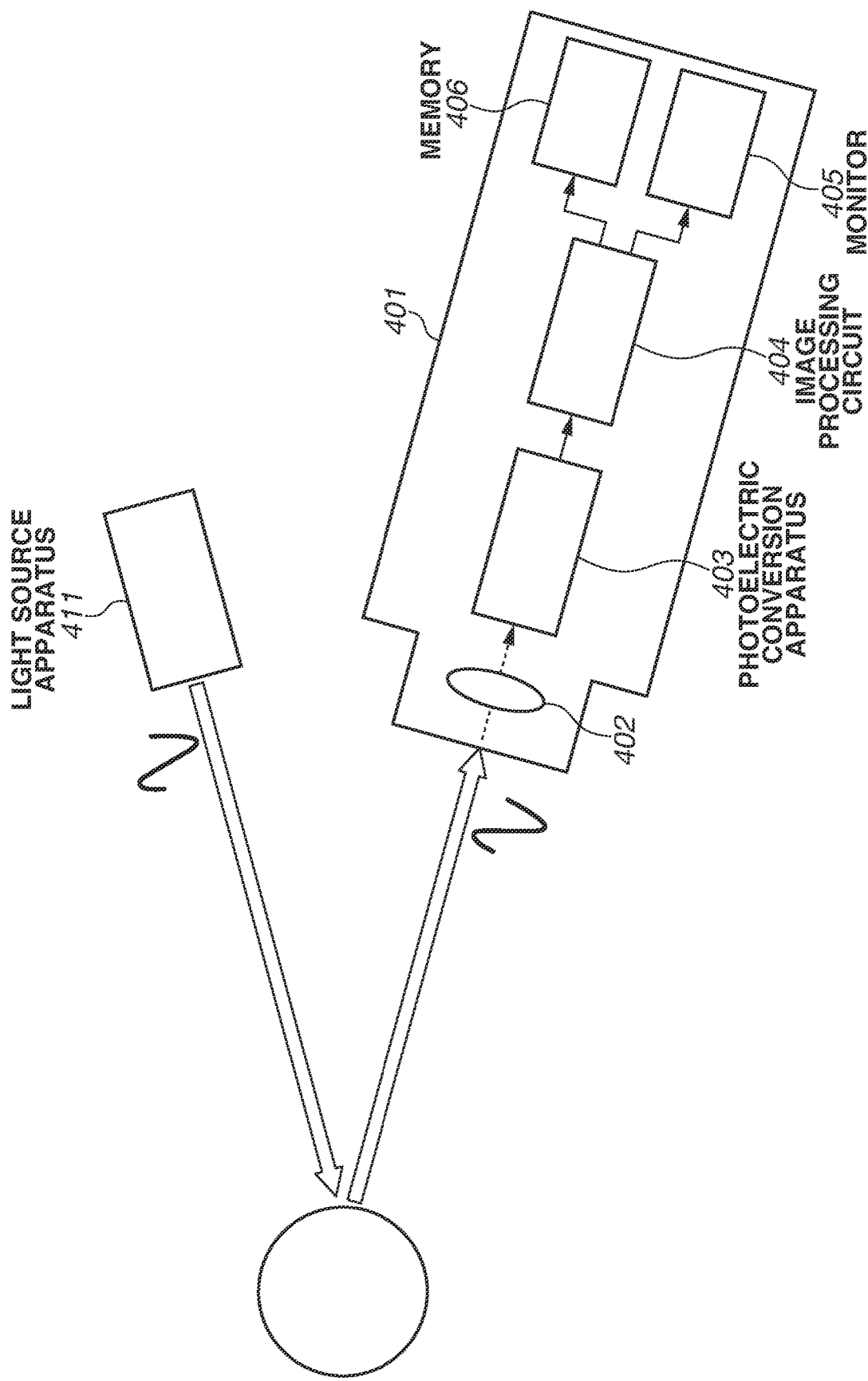
FIG. 20 is a function block diagram illustrating a photoelectric conversion system according to a sixth exemplary embodiment.

A photoelectric conversion system according to a sixth exemplary embodiment will be described below with reference to FIG. 20. FIG. 20 is a block diagram illustrating an example configuration of a distance image sensor that is the photoelectric conversion system according to the sixth exemplary embodiment.

As illustrated in FIG. 20, a distance image sensor 401 includes an optical system 402, a photoelectric conversion apparatus 403, an image processing circuit 404, a monitor 405, and a memory 406. A light source apparatus 411 emits light toward a subject. The distance image sensor 401 receives light (modulated light or pulsed light) reflected by a surface of the subject to acquire a distance image based on a distance to the subject.

The optical system 407 including one or a plurality of lenses guides image light (incident light) from the subject to the photoelectric conversion apparatus 403 to form an image on the light-receiving surface (sensor unit) of the photoelectric conversion apparatus 403.

The photoelectric conversion apparatus 100 according to each of the above-described exemplary embodiments is applied to the photoelectric conversion apparatus 403. The image processing circuit 404 is supplied with a distance signal indicating the distance obtained from a light receiving signal output from the photoelectric conversion apparatus 403.

The image processing circuit 404 performs image processing to structure distance image based on the distance signal supplied from the photoelectric conversion apparatus 403. The distance image (image data) obtained by the image processing is supplied to the monitor 405 for display or supplied to the memory 406 for storage (recording).

The distance image sensor 401 configured in this way applies the above-described photoelectric conversion apparatus 403 to enable acquisition of, for example, a more accurate distance image with an improvement of the pixel characteristics.

Figure 21:
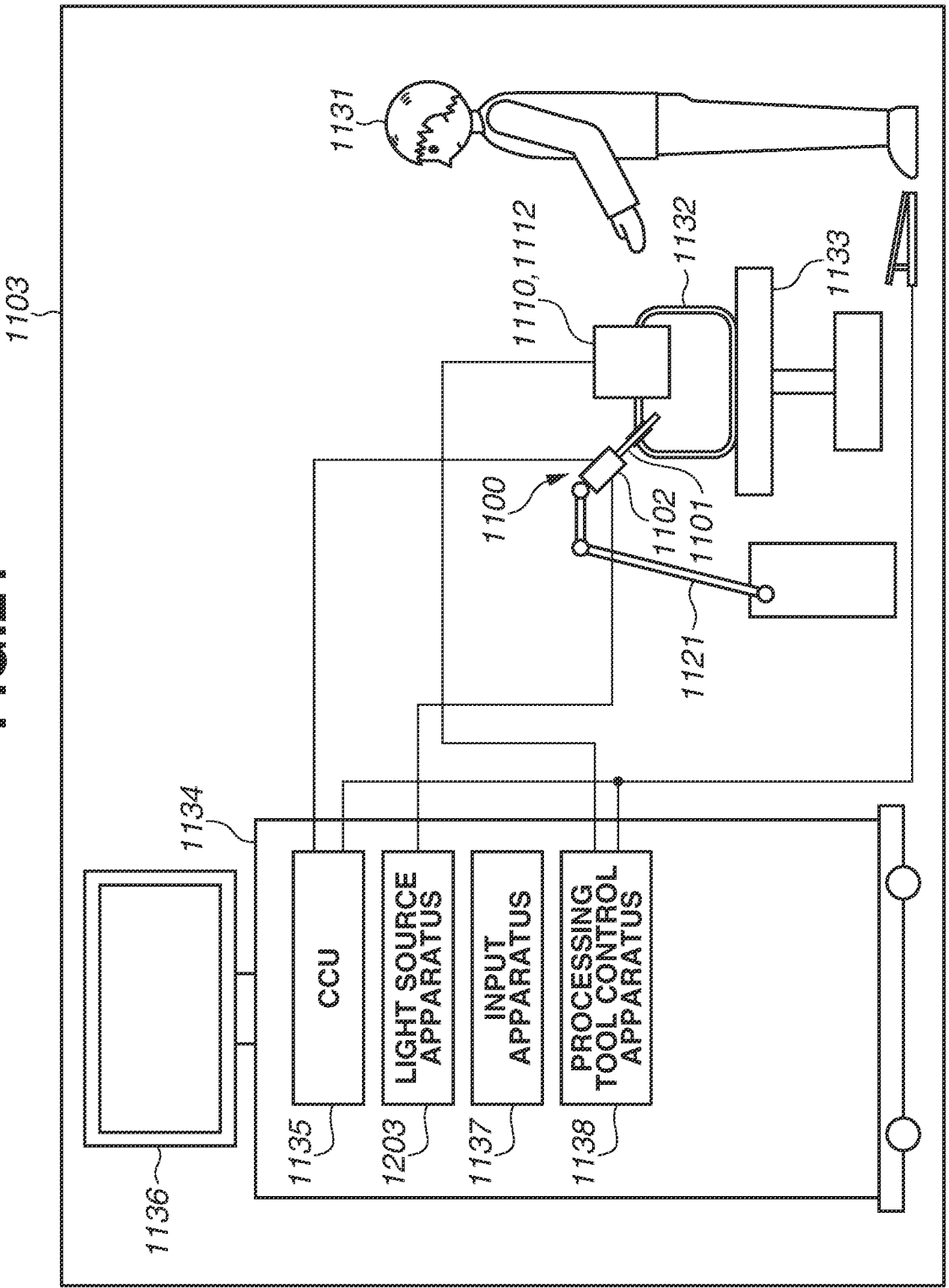
FIG. 21 is a function block diagram illustrating a photoelectric conversion system according to a seventh exemplary embodiment.

A photoelectric conversion system according to a seventh exemplary embodiment will be described below with reference to FIG. 21. FIG. 21 is a view schematically illustrating an example configuration of an endoscopic surgery system that is the photoelectric conversion system according to the seventh exemplary embodiment.

In FIG. 21, an operator (doctor) 1131 performs an operation on a patient 1132 on a patient bed 1133 by using an endoscopic surgery system 1103. As illustrated in FIG. 21, the endoscopic surgery system 1103 includes an endoscope 1100, an operation tool 1110, and a cart 1134 on which various apparatuses are mounted for endoscopic operations.

The endoscope 1100 includes a lens barrel 1101 a region thereof up to a predetermined length from the tip is to be inserted into a body cavity of the patient 1132, and a camera head 1102 connected to the base end of the lens barrel 1101. In the example illustrated in FIG. 21, although the endoscope 1100 is configured to be what is called a hard mirror having a hard lens barrel 1101, the endoscope 1100 may be configured to be what is called a flexible mirror having a flexible lens barrel 1101.

An opening into which an object lens is fitted is provided at the tip of the lens barrel 1101. The endoscope 1100 is connected with a light source apparatus 1203. Light generated by the light source apparatus 1203 is guided to the tip of the lens barrel 1101 by a light guide extended inside the lens barrel 1101, and then is emitted toward an observation object in the body cavity of the patient 1132 through the object lens. The endoscope 1100 may be a direct viewing mirror, an oblique viewing mirror, or a side viewing mirror.

An optical system and a photoelectric conversion apparatus 100 are disposed inside the camera head 1102. Reflected light (observation light) from the observation object is condensed onto the photoelectric conversion apparatus 100 by the optical system. The photoelectric conversion apparatus 100 photoelectrically converts the observation light to generate an electrical signal corresponding to the observation light, i.e., an image signal corresponding to an observation image. As the photoelectric conversion apparatus 100, the photoelectric conversion apparatus 100 according to each of the above-described exemplary embodiments can be used. The image signal is transmitted to a camera control unit (CCU) 1135 as RAW data.

The CCU 1135 includes a central processing unit (CPU) or a graphics processing unit (GPU) and totally controls operations of the endoscope 1100 and a display apparatus 1136. The CCU 1135 receives the image signal from the camera head 1102 and subjects the image signal to various image processing for displaying an image based on the image signal, such as development processing (demosaic processing).

The display apparatus 1136 displays an image based on the image signal having been subjected to the image processing by the CCU 1135 under the control of the CCU 1135.

The light source apparatus 1203 includes, for example, a light source such as a light emitting diode (LED) and supplies irradiation light used to capture an image of an operation target portion to the endoscope 1100.

An input apparatus 1137 is an input interface to the endoscopic surgery system 1150. The user can input various information and instructions to the endoscopic surgery system 1150 via the input apparatus 1137.

A processing tool control apparatus 1138 controls driving of an energy processing tool 1112 for cautery and incision of tissues and sealing of blood vessels.

The light source apparatus 1203 that supplies irradiation light used to capture an image of the operation target portion to the endoscope 1100 can include a white light source including, for example, an LED, a laser light source, or a combination of both. When a combination of RGB laser light sources constitutes the white light source, it is possible to control the output intensity and output timing of each color (each wavelength) with high accuracy and hence to subject a captured image to white balance adjustment by the light source apparatus 1203. In this case, it is also possible to capture an image corresponding to each of RGB on a time-sharing basis by irradiating the observation object with a laser beam from each of the RGB laser light sources on a time-sharing basis, and controlling drive of an image sensor of the camera head 1102 in synchronization with an irradiation timing. The method enables obtaining a color image without disposing color filters in the image sensor.

Drive of the light source apparatus 1203 may be controlled to change the intensity of output light at predetermined time intervals. It is possible to generate an image with a wide dynamic range, free from underexposure and overexposure, by controlling the drive of the image sensor of the camera head 1102 in synchronization with the timing of changing the light intensity to acquire images on a time-sharing basis and then combining the images.

The light source apparatus 1203 may be configured to be able to supply light in a predetermined wavelength band that enables special light observation. The special light observation utilizes, for example, the wavelength dependence of absorption of light in a body tissue. More specifically, by irradiating the observation object with narrower-band light than irradiation light used in normal observation (i.e., white light), an image of a predetermined tissue such as blood vessels in a superficial portion of the mucous membrane is captured with high contrast.

Alternatively, in the special light observation, fluorescence observation may be performed in which an image of fluorescence generated by excitation light irradiation is captured. The fluorescence observation enables irradiating a body tissue with excitation light to observe the fluorescence from the body tissue, or enables locally injecting a reagent such as indocyanine green (ICG) into the body tissue, and irradiating the body tissue with excitation light corresponding to a fluorescence wavelength of the reagent to obtain a fluorescence image. The light source apparatus 1203 can be configured to be able to supply narrow-band light and/or excitation light that enables such special light observation.

Figure 22A:
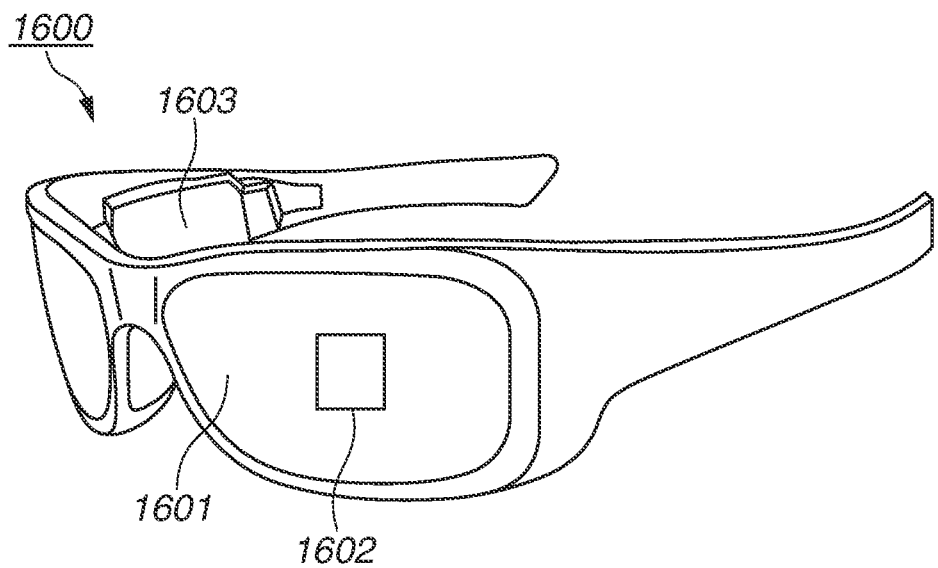
FIGS. 22A and 22B are function block diagrams illustrating a photoelectric conversion system according to an eighth exemplary embodiment.

A photoelectric conversion system according to an eighth exemplary embodiment will be described below with reference to FIGS. 22A and 22B. FIG. 22A illustrates glasses 1600 (smart glasses) that are the photoelectric conversion system according to the eighth exemplary embodiment. The glasses 1600 include a photoelectric conversion apparatus 1602. The photoelectric conversion apparatus 1602 is the photoelectric conversion apparatus 100 according to each of the above-described exemplary embodiments. A display apparatus including a light emitting apparatus such as an organic light emitting diode (OLED) or an LED may be disposed on the back surface side of a lens 1601. The glasses 1600 may include one or a plurality of photoelectric conversion apparatuses 1602, or include a combination of a plurality of types of the photoelectric conversion apparatuses 1602. An arrangement position of the photoelectric conversion apparatus 1602 is not limited to that in FIG. 22A.

The glasses 1600 further include a control apparatus 1603. The control apparatus 1603 functions as a power source that supplies power to the photoelectric conversion apparatus 1602 and the above-described display apparatus. The control apparatus 1603 controls operations of the photoelectric conversion apparatus 1602 and the display apparatus. An optical system for condensing light onto the photoelectric conversion apparatus 1602 is formed on the lens 1601.

Figure 22B:
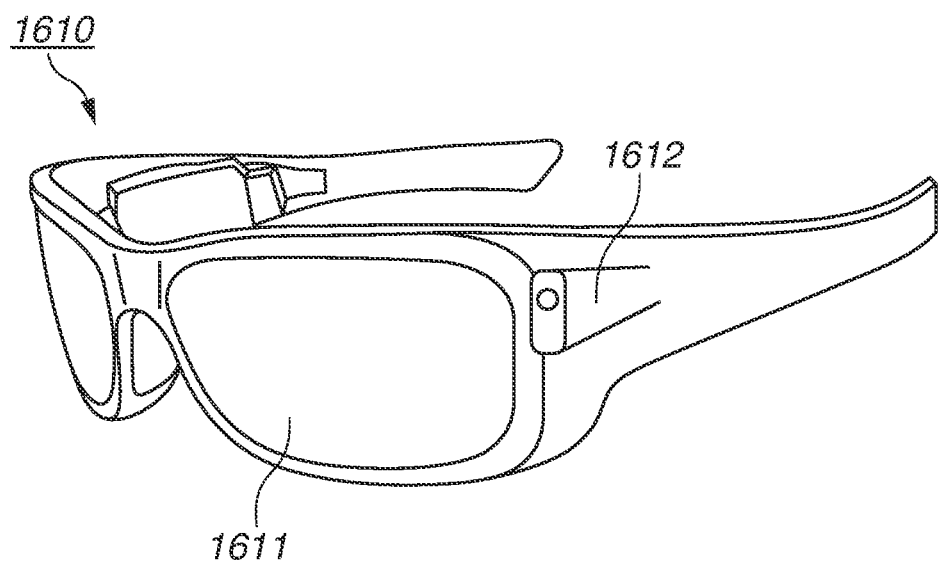

FIG. 22B illustrates glasses 1610 (smart glasses) according to an example application. The glasses 1610 include a control apparatus 1612, and on the control apparatus 1612, a photoelectric conversion apparatus 100 equivalent to the photoelectric conversion apparatus 1602 and a display apparatus are mounted. The photoelectric conversion apparatus 100 in the control apparatus 1612 and an optical system for projecting light emitted from the display apparatus are formed on a lens 1611 on which an image is projected. The control apparatus 1612 functions as a power source that supplies power to the photoelectric conversion apparatus 100 and the display apparatus, and controls operations of the photoelectric conversion apparatus 100 and the display apparatus. The control apparatus 1612 may include a line-of-sight detection unit that detects a line of sight of a wearer. Infrared radiation may be used to detect the line of sight. An infrared emission unit emits infrared light to eyeballs of the user who is gazing at a display image. When an imaging unit including a light receiving element detects reflected light of the emitted infrared light from the eyeballs, a captured image of the eyeballs is obtained. Degradation of the image quality can be reduced by a reduction unit that reduces light from the infrared emission unit to a display unit in the planar view.

The user's line of sight to the display image is detected based on the captured image of the eyeballs obtained by infrared imaging. Any known technique is applicable to line-of-sight detection using the captured image of the eyeballs. Examples of an applicable technique include a line-of-sight detection method based on a Purkinje image, which is a reflection of irradiation light from the cornea.

More specifically, line-of-sight detection processing based on the pupil cornea reflection method is performed. The use of the pupil cornea reflection method enables detection of the user's line of sight by calculation of a line-of-sight vector representing the orientation (rotational angle) of the eyeballs based on a pupillary image and a Purkinje image included in the captured image of the eyeballs.

The display apparatus according to the present exemplary embodiment may include a photoelectric conversion apparatus 1602 including a light receiving element, and the display image of the display apparatus may be controlled based on line-of-sight information about the user from the photoelectric conversion apparatus 1602.

More specifically, for the display apparatus, a first vision range to be gazed at by the user and a second vision range other than the first vision range are determined based on the line-of-sight information. The first and second vision ranges may be determined by the control apparatus of the display apparatus, or received from an external control apparatus that has determined the vision ranges. In a display region of the display apparatus, a display resolution of the first vision range may be controlled to be higher than that of the second vision range. In other words, the resolution of the second vision range may be lower than that of the first vision range.

The display region includes a first display region and a second display region different from the first display region. A region having a higher priority may be determined based on the first and second display regions based on the line-of-sight information. The first and second vision ranges may be determined by the control apparatus of the display apparatus, or received from an external control apparatus that has determined the vision ranges. The resolution of the region having a higher priority may be controlled to be higher than that of the region other than the region having a higher priority. In other words, the region having a relatively lower priority may have a low resolution.

The first vision range and the region having a higher priority may be determined by using an artificial intelligence (AI). The AI may be a model configured to estimate an angle of the line of sight and a distance to a target object on the line of sight based on an image of the eyeballs by using the image of the eyeballs and a direction in which the eyeballs in the image are actually looking, as teacher data. An AI program may be held by the display apparatus, the photoelectric conversion apparatus 1602, or an external apparatus. In a case where the AI program is held by the external apparatus, the AI program is transmitted to the display apparatus through communication.

In a case where display control is performed based on visual recognition detection, the disclosure is suitably applicable to smart glasses further including a photoelectric conversion apparatus 1602 that captures an image of the outside. The smart glasses can display captured external information in real time.

The disclosure is not limited to the above-described exemplary embodiments but can be modified in diverse ways.

For example, the exemplary embodiments of the disclosure also include an example case where a part of the configuration of any one exemplary embodiment is added to another exemplary embodiment, or an example case where a part of the configuration of any one exemplary embodiment is replaced with a part of the configuration of another exemplary embodiment.

The photoelectric conversion systems according to the fourth and fifth exemplary embodiments are examples of photoelectric conversion systems to which the photoelectric conversion apparatus 100 of the disclosure is applicable. The photoelectric conversion systems to which the photoelectric conversion apparatus 100 of the disclosure is applicable is not limited to the configurations illustrated in FIGS. 18 to 19B. The same applies to a ToF system according to the sixth exemplary embodiment, the endoscope according to the seventh exemplary embodiment, and the smart glasses according to the eighth exemplary embodiment.

The above-described exemplary embodiments are to be considered as illustrative in embodiment of the disclosure, and are not to be interpreted as restrictive on the technical scope of the disclosure. More specifically, the disclosure may be embodied in diverse forms without departing from the technical concepts or essential characteristics thereof.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-144929, filed Sep. 6, 2021, which is hereby incorporated by reference herein in its entirety.

What is claimed is:

1. A photoelectric conversion apparatus comprising:
a plurality of avalanche diodes disposed in a semiconductor layer having a first surface and a second surface facing the first surface; and
a light shielding portion having an opening, the light shielding portion covering at least part of the first surface,
wherein each of the plurality of avalanche diodes includes a first semiconductor region of a first conductivity type disposed at a first depth, and a second semiconductor region of a second conductivity type disposed at a second depth deeper than the first depth with respect to the second surface,
wherein the semiconductor layer includes a plurality of uneven structures provided on the first surface, and
wherein, in a planar view from a direction perpendicular to the first surface, the second semiconductor region overlaps the light shielding portion, and the first semiconductor region is included in the opening.

2. The photoelectric conversion apparatus according to claim 1, wherein an effective pitch of the plurality of uneven structures is smaller than $hc/E_a$ where h denotes Planck's constant [J·s], c denotes a velocity of light [m/s], and $E_a$ denotes a band gap [J] of a substrate.

3. The photoelectric conversion apparatus according to claim 1,
wherein the plurality of uneven structures is formed to have a trench structure, and
wherein a width of the trench structure is smaller than $hc/2E_a$ where h denotes Planck's constant [J·s], c denotes a velocity of light [m/s], and $E_a$ denotes a band gap [J] of a substrate.

4. The photoelectric conversion apparatus according to claim 1, wherein an effective pitch of the plurality of uneven structures is smaller than 1.1 µm.

5. The photoelectric conversion apparatus according to claim 1,
wherein the plurality of uneven structures is formed to have a trench structure, and
wherein a width of the trench structure is smaller than 0.55 µm.

6. The photoelectric conversion apparatus according to claim 1, wherein a third semiconductor region of the second conductivity type is disposed at a third depth deeper than the second depth with respect to the second surface.

7. The photoelectric conversion apparatus according to claim 6,
wherein a fourth semiconductor region of the first conductivity type is disposed between the second and third semiconductor regions, and
wherein an impurity concentration of the first conductivity type in the fourth semiconductor region is lower than the impurity concentration of the first conductivity type in the first semiconductor region.

8. The photoelectric conversion apparatus according to claim 7, wherein an area of the fourth semiconductor region in the planar view from the direction perpendicular to the first surface is larger than an area of the opening.

9. The photoelectric conversion apparatus according to claim 1,
wherein a fifth semiconductor region surrounding the first semiconductor region in the planar view from the first surface is disposed at the first depth, and
wherein an impurity concentration in the fifth semiconductor region is lower than an impurity concentration in the first semiconductor region.

10. The photoelectric conversion apparatus according to claim 9, wherein a potential difference between the first and second semiconductor regions is larger than a potential difference between the second and fifth semiconductor regions.

11. The photoelectric conversion apparatus according to claim 1,
wherein the plurality of avalanche diodes includes a first avalanche diode and a second avalanche diode adjacent to the first avalanche diode, and
wherein a pixel separation portion is disposed between the first and second avalanche diodes.

12. The photoelectric conversion apparatus according to claim 11,
wherein the plurality of avalanche diodes includes a third avalanche diode adjacent to the second avalanche diode,
wherein a first pixel separation portion is disposed between the first and second avalanche diodes,
wherein a second pixel separation portion is disposed between the second and third avalanche diodes, and
wherein the second semiconductor region in the second avalanche diode extends from the first pixel separation portion to the second pixel separation portion in a cross section perpendicular to the first surface.

13. The photoelectric conversion apparatus according to claim 1, further comprising a reflection member configured to cover at least part of the first surface side of the semiconductor layer.

14. The photoelectric conversion apparatus according to claim 1, wherein each of the plurality of avalanche diodes has a microlens disposed on the first surface side.

15. The photoelectric conversion apparatus according to claim 14, further comprising:
- an insulation film disposed between the first surface and the microlens; and
- a waveguide having a higher refraction index than the insulation film, the waveguide being disposed in the insulation film.

16. The photoelectric conversion apparatus according to claim 14, further comprising:
- a silicon monoxide (SiO) film disposed between the first surface and the microlens; and
- a waveguide made of silicon nitride (SiN) or silicon oxynitride (SiON) disposed in the SiO film.

17. The photoelectric conversion apparatus according to claim 15,
wherein the waveguide has a lower surface close to the first surface, and an upper surface that faces the lower surface and is far from the first surface, and
wherein the upper surface includes the opening in a planar view from a direction perpendicular to a light incidence surface.

18. The photoelectric conversion apparatus according to claim 17,
wherein the light shielding portion has a third surface close to the first surface, and a fourth surface that faces a lower surface and is far from the first surface, and
wherein the lower surface of the waveguide is disposed between the third and fourth surfaces of the light shielding portion.

19. The photoelectric conversion apparatus according to claim 1, wherein an area of a range where the uneven structures are formed is larger than an area of the opening.

20. The photoelectric conversion apparatus according to claim 1, wherein the plurality of uneven structures overlaps the light shielding portion in the planar view from the direction perpendicular to the first surface.

21. A photoelectric conversion system comprising:
- the photoelectric conversion apparatus according to claim 1; and
- a signal processing circuit configured to generate an image using a signal output by the photoelectric conversion apparatus.

22. A moving body including the photoelectric conversion apparatus according to claim 1, the moving body comprising:
- a control circuit configured to control movement of the moving body by using a signal output by the photoelectric conversion apparatus.

* * * * *